US011139298B2

(12) United States Patent
Harada et al.

(10) Patent No.: US 11,139,298 B2
(45) Date of Patent: Oct. 5, 2021

(54) ELECTRONIC DEVICE

(71) Applicant: SEMICONDUCTOR ENERGY LABORATORY CO., LTD., Atsugi (JP)

(72) Inventors: Shintaro Harada, Kanagawa (JP); Tatsunori Inoue, Kanagawa (JP); Yoshiyuki Kurokawa, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/638,799

(22) PCT Filed: Aug. 27, 2018

(86) PCT No.: PCT/IB2018/056473
§ 371 (c)(1),
(2) Date: Feb. 13, 2020

(87) PCT Pub. No.: WO2019/048979
PCT Pub. Date: Mar. 14, 2019

(65) Prior Publication Data
US 2021/0134801 A1 May 6, 2021

(30) Foreign Application Priority Data
Sep. 6, 2017 (JP) .............................. JP2017-170825

(51) Int. Cl.
H01L 27/00 (2006.01)
H01L 29/00 (2006.01)
(Continued)

(52) U.S. Cl.
CPC ......... H01L 27/1052 (2013.01); G06N 3/063 (2013.01); H01L 27/124 (2013.01);
(Continued)

(58) Field of Classification Search
CPC ............. H01L 27/1052; H01L 27/1207; H01L 27/1225; H01L 27/124; H01L 27/1255;
(Continued)

(56) References Cited

U.S. PATENT DOCUMENTS 5,296,752 A * 3/1994 Groeneveld ......... G11C 27/028
327/91
8,363,452 B2 1/2013 Yamazaki et al.
(Continued)

FOREIGN PATENT DOCUMENTS

DE 102016211033 12/2016
JP 2003-234624 A 8/2003
(Continued)

OTHER PUBLICATIONS

International Search Report (Application No. PCT/IB2018/056473) dated Dec. 18, 2018.
(Continued)

Primary Examiner — Nikolay K Yushin
(74) Attorney, Agent, or Firm — Fish & Richardson P.C.

(57) ABSTRACT

An electronic device including a semiconductor device capable of intermittent driving is provided. The electronic device includes a semiconductor device, and the semiconductor device includes a current mirror circuit, a bias circuit, and first to third transistors. The current mirror circuit includes a first output terminal and a second output terminal, and the current mirror circuit is electrically connected to a power supply line through the first transistor. The current mirror circuit has a function of outputting current corresponding to a potential of the first output terminal from the first output terminal and the second output terminal. The bias circuit includes a current source circuit and a current sink circuit, the current source circuit is electrically connected to the second output terminal through the second transistor, and
(Continued)

the current sink circuit is electrically connected to the second output terminal through the third transistor. Switching on/off states of the first to third transistors achieves intermittent driving of the semiconductor device.

16 Claims, 15 Drawing Sheets

(51) Int. Cl.
    *H01L 27/105*      (2006.01)
    *G06N 3/063*      (2006.01)
    *H01L 27/12*      (2006.01)
    *H01L 29/786*      (2006.01)

(52) U.S. Cl.
    CPC ...... *H01L 27/1207* (2013.01); *H01L 27/1225* (2013.01); *H01L 27/1255* (2013.01); *H01L 29/7869* (2013.01); *H01L 29/78648* (2013.01)

(58) Field of Classification Search
    CPC .......... H01L 29/78648; H01L 29/7869; H01L 29/78; H01L 29/785; H01L 29/786; G06N 3/063; G06N 3/0481; G06N 3/0454; G06N 3/08; G06N 3/0635; G06N 3/0445; G06N 3/0472
    See application file for complete search history.

(56) References Cited

U.S. PATENT DOCUMENTS

| | | | |
|---|---|---|---|
| 8,482,974 B2* | 7/2013 | Saito | ............... G11C 11/405 365/177 |
| 9,870,827 B2 | 1/2018 | Nakagawa et al. | |
| 10,490,553 B2 | 11/2019 | Yamazaki | |
| 10,545,526 B2 | 1/2020 | Inoue et al. | |
| 2011/0199807 A1* | 8/2011 | Saito | ............ H01L 27/11521 365/72 |
| 2012/0033487 A1* | 2/2012 | Inoue | ............... H01L 27/108 365/149 |
| 2016/0343452 A1 | 11/2016 | Ikeda et al. | |
| 2016/0379564 A1 | 12/2016 | Inoue et al. | |
| 2017/0116512 A1 | 4/2017 | Kurokawa | |
| 2017/0154678 A1 | 6/2017 | Nakagawa et al. | |

FOREIGN PATENT DOCUMENTS

| | | |
|---|---|---|
| JP | 2017-011704 A | 1/2017 |
| JP | 2017-107558 A | 6/2017 |
| JP | 2019-046337 A | 3/2019 |
| JP | 2019-046358 A | 3/2019 |
| KR | 2017-0001613 A | 1/2017 |
| KR | 2017-0061602 A | 6/2017 |

OTHER PUBLICATIONS

Written Opinion (Application No. PCT/IB2018/056473) dated Dec. 18, 2018.

* cited by examiner

ELECTRONIC DEVICE

CROSS REFERENCE TO RELATED APPLICATIONS

This application is a U.S. National Phase Application under 35 U.S.C. § 371 of International Application PCT/IB2018/056473, filed on Aug. 27, 2018, which is incorporated by reference and which claims the benefit of a foreign priority application filed in Japan on Sep. 6, 2017, as Application No. 2017-170825.

TECHNICAL FIELD

One embodiment of the present invention relates to an electronic device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a processor, an electronic device, a system, a driving method thereof, a manufacturing method thereof, and a testing method thereof.

BACKGROUND ART

An artificial neural network is an information processing system modeled on a biological neural network. With the use of an artificial neural network, computers with higher performance than conventional von Neumann computers are expected to be achieved, and in recent years, a variety of researches for building artificial neural networks in electronic circuits have been carried out.

In particular, Patent Document 1 discloses an invention in which weight data necessary for computation with an artificial neural network is retained in a memory device including a transistor that contains an oxide semiconductor in its channel formation region.

PRIOR ART DOCUMENT

Patent Document

[Patent Document 1] United States Patent Application Publication No. 2016/0343452

SUMMARY OF THE INVENTION

Problems to be Solved by the Invention

In order to construct a hierarchical artificial neural network as a semiconductor device, it is necessary to achieve a product-sum operation circuit in which the connection strength between a plurality of first neurons in a first layer and one of second neurons in a second layer is stored, the output of each of the first neurons in the first layer and the corresponding connection strength are multiplied, and the products are summed. In other words, a memory that holds the connection strength, a multiplier circuit and an adder circuit which perform a product-sum operation, and the like are necessarily mounted on the semiconductor device.

In the case where the memory, the multiplier circuit, the adder circuit, and the like are formed using digital circuits, the memory needs to be able to store multi-bit data and moreover, the multiplier circuit and the adder circuit need to be able to perform multi-bit arithmetic operation. In other words, a large-scale memory, a large-scale multiplier circuit, and a large-scale adder circuit are required in order to construct a neural network using digital circuits; therefore, the chip area of the digital circuits is increased.

In addition, a shoot-through current might be generated in a certain type of circuit for forming an artificial neural network when the circuit is driven, which increases the power consumption of the circuit.

An object of one embodiment of the present invention is to provide an electronic device including a novel semiconductor device including an arithmetic circuit. Another object of one embodiment of the present invention is to provide an electronic device including a novel semiconductor device with low power consumption.

Note that the objects of one embodiment of the present invention are not limited to the objects listed above. The objects listed above do not preclude the existence of other objects. The other objects are objects that are not described in this section and will be described below. The other objects that are not described in this section will be derived from the description of the specification, the drawings, and the like and can be extracted from these descriptions by those skilled in the art. Note that one embodiment of the present invention is to solve at least one of the objects listed above and the other objects. Note that one embodiment of the present invention does not necessarily solve all the objects listed above and the other objects.

(1)

One embodiment of the present invention is an electronic device including a semiconductor device, which is characterized in the following: the semiconductor device includes a first circuit, a memory cell array, and a switch; the first circuit includes a current mirror circuit, a second circuit, a first output terminal, and a second output terminal; the first output terminal is electrically connected to the memory cell array; the second output terminal is electrically connected to the memory cell array and a first terminal of the switch; the current mirror circuit includes a third output terminal, a fourth output terminal, and a first transistor; the third output terminal is electrically connected to the first output terminal; the fourth output terminal is electrically connected to the second output terminal; a first terminal of the first transistor is electrically connected to a wiring that supplies power supply voltage to the current mirror circuit; the current mirror circuit has a function of outputting current corresponding to a potential of the third output terminal to the third output terminal and the fourth output terminal; the second circuit includes a current source circuit, a current sink circuit, a second transistor, and a third transistor; a first terminal of the second transistor is electrically connected to a first terminal of the third transistor and the second output terminal; a second terminal of the second transistor is electrically connected to the current source circuit; and a second terminal of the third transistor is electrically connected to the current sink circuit.

(2)

Another embodiment of the present invention is the electronic device according to (1), which is characterized in the following: the current mirror circuit includes fourth to sixth transistors; each of the first transistor and the fourth to sixth transistors is a p-channel transistor; a first terminal of the fourth transistor is electrically connected to a second terminal of the first transistor and the third output terminal; a second terminal of the fourth transistor is electrically connected to a gate of the first transistor; a first terminal of the fifth transistor is electrically connected to the fourth output terminal; and a first terminal of the sixth transistor is electrically connected to the gate of the first transistor and a gate of the fifth transistor.

(3)

Another embodiment of the present invention is the electronic device according to (1) or (2), which is characterized in the following: the current source circuit includes a seventh transistor, an eighth transistor, and a first capacitor; each of the second transistor and the seventh transistor is a p-channel transistor; the eighth transistor is an n-channel transistor; a first terminal of the seventh transistor is electrically connected to the second terminal of the second transistor and a first terminal of the eighth transistor; a gate of the seventh transistor is electrically connected to a second terminal of the eighth transistor and a first terminal of the first capacitor; and a second terminal of the seventh transistor is electrically connected to a second terminal of the first capacitor.

(4)

Another embodiment of the present invention is the electronic device according to (3), which is characterized in that the eighth transistor includes a metal oxide in a channel formation region.

(5)

Another embodiment of the present invention is the electronic device according to any one of (1) to (4), which is characterized in the following: the current sink circuit includes a ninth transistor, a tenth transistor, and a second capacitor; the third transistor, the ninth transistor, and the tenth transistor are n-channel transistors; a first terminal of the ninth transistor is electrically connected to the second terminal of the third transistor and a first terminal of the tenth transistor; a gate of the ninth transistor is electrically connected to a second terminal of the tenth transistor and a first terminal of the second capacitor; and a second terminal of the ninth transistor is electrically connected to a second terminal of the second capacitor.

(6)

Another embodiment of the present invention is the electronic device according to (5), which is characterized in that at least one of the third transistor, the ninth transistor, and the tenth transistor includes a metal oxide in a channel formation region.

(7)

Another embodiment of the present invention is the electronic device according to any one of (1) to (6), which is characterized in the following: the memory cell array includes a first memory cell and a second memory cell; each of the first memory cell and the second memory cell includes an eleventh transistor, a twelfth transistor, and a third capacitor; in each of the first memory cell and the second memory cell, a first terminal of the eleventh transistor is electrically connected to a gate of the twelfth transistor and a first terminal of the third capacitor; a first terminal of the twelfth transistor in the first memory cell is electrically connected to the first output terminal; and a first terminal of the twelfth transistor in the second memory cell is electrically connected to the second output terminal and the first terminal of the switch.

(8)

Another embodiment of the present invention is the electronic device according to (7), which is characterized in that the eleventh transistor in each of the first memory cell and the second memory cell includes a metal oxide in a channel formation region.

(9)

Another embodiment of the present invention is the electronic device according to any one of (1) to (8), which is characterized in the following: the electronic device includes a third circuit; the third circuit includes an input terminal and a fifth output terminal; the input terminal is electrically connected to a second terminal of the switch; and the third circuit samples an amount of change in current input to the input terminal, and outputs a potential corresponding to the amount of change to the fifth output terminal.

(10)

Another embodiment of the present invention is the electronic device described in any one of (1) to (9), which performs sound recognition and/or pattern recognition using arithmetic processing of artificial intelligence.

(11)

Another embodiment of the present invention is the electronic device described in any one of (1) to (9), which performs biometric identification using arithmetic processing of artificial intelligence.

One embodiment of the present invention can provide a novel semiconductor device including an arithmetic circuit. Alternatively, one embodiment of the present invention can provide a novel semiconductor device with reduced power consumption.

Alternatively, one embodiment of the present invention can provide an electronic device including a novel semiconductor device.

Note that the effects of one embodiment of the present invention are not limited to the effects listed above. The effects listed above do not preclude the existence of other effects. The other effects are effects that are not described in this section and will be described below. The other effects that are not described in this section will be derived from the description of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

MODE FOR CARRYING OUT THE INVENTION

Figure 1:
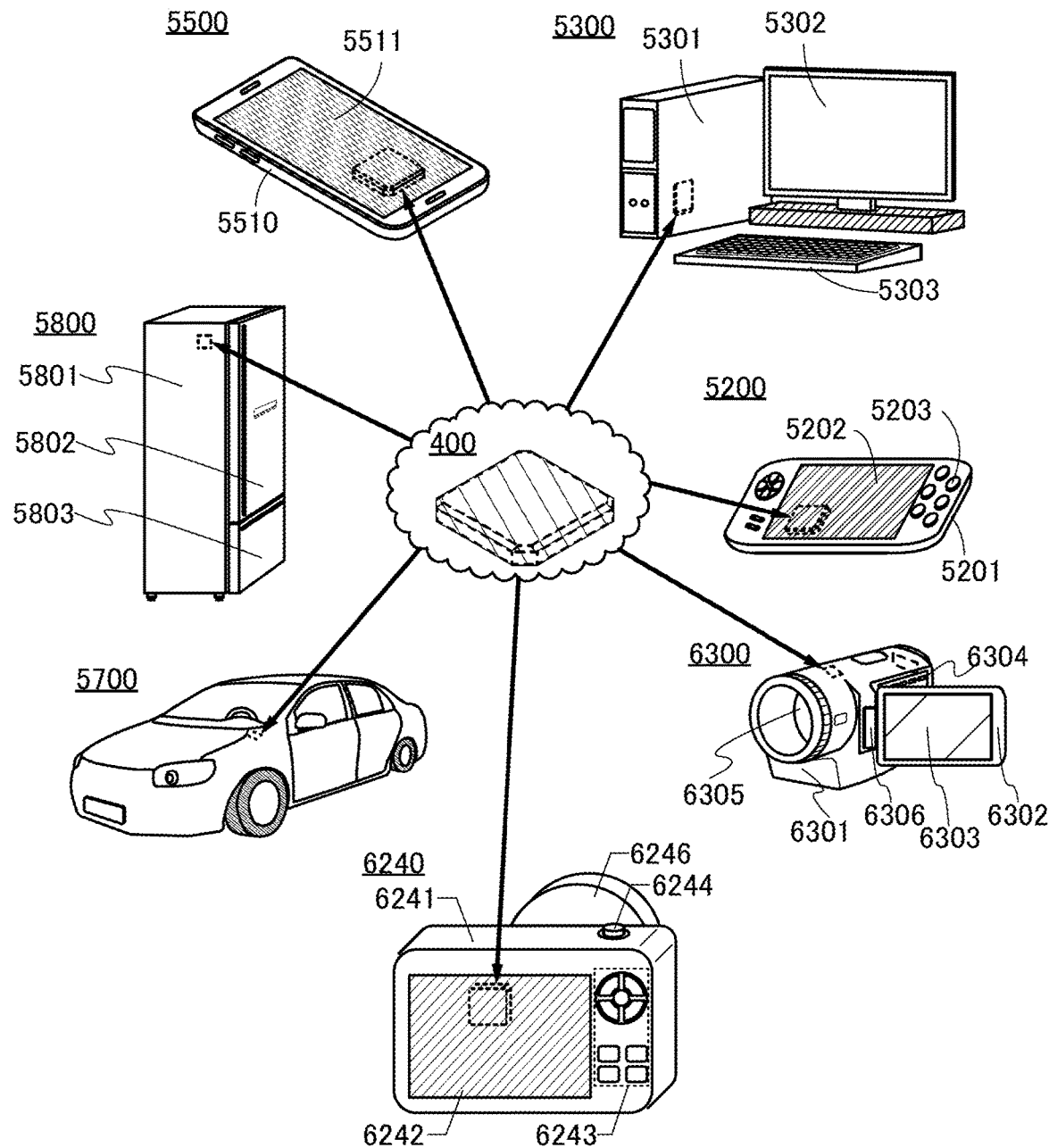
FIG. 1 A diagram illustrating examples of electronic devices.

In this specification and the like, an artificial neural network (ANN, hereinafter referred to as a neural network) generally means a model that imitates a biological neural network. In general, a neural network has a structure in which units that imitate neurons are connected to each other through a unit that imitates a synapse.

The connection strength of the synapse (also referred to as the connection strength of neurons or a weight coefficient) can be changed by providing the neural network with existing data. The processing for determining a connection strength by providing a neural network with existing data in such a manner is called "learning" in some cases.

Furthermore, when a neural network in which "learning" has been performed (a connection strength has been determined) is provided with some type of data, new data can be output on the basis of the connection strength. The processing for outputting new data on the basis of provided data and a connection strength in a neural network in such a manner is called "inference" or "recognition" in some cases.

Examples of the model of a neural network include a hopfield type and a hierarchical type. In particular, a neural network with a multilayer structure is called a "deep neural network" (DNN), and machine learning using a deep neural network is called "deep learning" in some cases.

In this specification and the like, a metal oxide is an oxide of metal in a broad expression. Metal oxides are classified into an oxide insulator, an oxide conductor (including a transparent oxide conductor), an oxide semiconductor (also simply referred to as OS), and the like. For example, when a metal oxide is used in an active layer of a transistor, the metal oxide is called an oxide semiconductor in some cases. That is, when a metal oxide can form a channel formation region of a transistor that has at least one of an amplifying function, a rectifying function, and a switching function, the metal oxide can be referred to as a metal oxide semiconductor or shortly as an OS. Moreover, when an OS FET (or an OS transistor) is described, it can also be referred to as a transistor including a metal oxide or an oxide semiconductor.

Embodiment 1

In this embodiment, electronic devices and the like, which are embodiments of the present invention, will be described.

An electronic device or the like of one embodiment of the present invention includes a semiconductor device that performs artificial intelligence processing. Examples of the semiconductor device performing artificial intelligence processing include a semiconductor chip having parallel processing architecture and including an FPGA or the like. In particular, the use of an OSAI chip 400 described in Embodiment 2 as the semiconductor chip can reduce power consumption needed for performing artificial intelligence processing. Furthermore, the OSAI chip 400 can perform intermittent driving by including an arithmetic circuit MACF described in Embodiment 3.

<Electronic Devices and Systems>

Examples of electronic devices of electronic devices of one embodiment of the present invention include a digital camera, a digital video camera, a digital photo frame, a mobile phone, a portable game console, a portable information terminal, and an audio reproducing device in addition to electronic devices provided with a relatively large screen, such as a television device, a desktop or laptop personal computer, a monitor for a computer and the like, digital signage, and a large game machine like a pachinko machine. In addition, when the integrated circuit or the computer of one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

FIG. 1 illustrates a plurality of application examples of the OSAI chip 400 to electronic devices.

[Mobile Phone]

An information terminal 5500 illustrated in FIG. 1 is a mobile phone (smartphone), which is a type of information terminal. The information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence with the use of the OSAI chip 400 described in Embodiment 2. Examples of the application utilizing artificial intelligence include an application for interpreting a conversation and displaying its content on the display portion 5511; an application for recognizing the letters, figures, and the like input to the touch panel of the display portion 5511 by a user and displaying them on the display portion 5511; and an application for biometric authentication using fingerprints, voice prints, or the like.

[Information Terminal 1]

FIG. 1 illustrates a desktop information terminal 5300. The desktop information terminal 5300 includes a main body 5301 of the information terminal, a display 5302, and a keyboard 5303.

The desktop information terminal 5300 can execute an application utilizing artificial intelligence with the use of the OSAI chip 400 described in Embodiment 2, like the information terminal 5500 described above. Examples of the application utilizing artificial intelligence include design-support software, text correction software, and automatic menu making software. Furthermore, with the use of the desktop information terminal 5300, novel artificial intelligence can be developed.

Note that although FIG. 1 illustrates the smartphone and the desktop information terminal as examples of the electronic device, one embodiment of the present invention can also be applied to an information terminal other than the smartphone or the desktop information terminal. Examples of the information terminal other than the smartphone or the desktop information terminal include a personal digital assistant (PDA), a laptop information terminal, and a workstation.

[Household Appliance]

FIG. 1 illustrates an electric refrigerator-freezer 5800 as an example of a household appliance. The electric refrigerator-freezer 5800 includes a housing 5801, a door for a refrigerator 5802, a door for a freezer 5803, and the like.

When the OSAI chip 400 described in Embodiment 2 is used for the electric refrigerator-freezer 5800, the electric refrigerator-freezer 5800 including artificial intelligence can be obtained. Utilizing the artificial intelligence enables the electric refrigerator-freezer 5800 to have a function of automatically making a menu on the basis of food stuffs stored in the electric refrigerator-freezer 5800 and their consume-by dates, a function of automatically adjusting the temperature to be appropriate for the food stuffs stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 1 illustrates a portable game machine 5200 as an example of a game machine. The portable game machine includes a housing 5201, a display portion 5202, a button 5203, and the like.

The portable game machine 5200 including the OSAI chip 400 described in Embodiment 2 can have low power consumption. Furthermore, heat generation from a circuit can be reduced owing to low power consumption; therefore, the influence of heat generation on the circuit, the peripheral circuit, and the module can be reduced.

Furthermore, when the OSAI chip 400 described in Embodiment 2 is used for the portable game machine 5200, the portable game machine 5200 including artificial intelligence can be obtained.

In general, progress of a game, actions and words of game characters, and expressions of a phenomenon in the game are programed in the game; however, the use of artificial intelligence in the portable game machine 5200 enables expression not limited by the game program. For example, questions posed by the player, progress of the game, time, and actions and words of the game characters can be changed for various expressions.

In addition, the artificial intelligence can construct a virtual game player and thus, a game that needs a plurality of players can be played by only one human game player with the portable game machine 5200, with the use of a virtual game player constructed by the artificial intelligence as an opponent.

Although FIG. 1 illustrates the portable game machine as an example of a game machine, the electronic device of one embodiment of the present invention is not limited thereto. Examples of the electronic device of one embodiment of the present invention include a home stationary game machine, an arcade game machine installed in an entertainment facility (a game center, an amusement park, or the like), and a throwing machine for batting practice installed in sports facilities.

[Moving Vehicle]

The OSAI chip 400 described in Embodiment 2 can be applied to an automobile, which is a moving vehicle, and the periphery of a driver's seat in an automobile.

FIG. 1 illustrates an automobile 5700 as an example of a moving vehicle.

An instrument panel that provides various kinds of information by displaying a speedometer, a tachometer, a mileage, a fuel quantity, a gearshift indicator, air-conditioning settings, and the like is provided around the driver's seat in the automobile 5700. In addition, a display device showing the above information may be provided around the driver's seat.

In particular, the display device can provide the view obstructed by the pillar or the like, the blind areas for the driver's seat, and the like to the driver by displaying an image taken by an imaging device (not illustrated) provided for the automobile 5700. That is, displaying an image taken by the imaging device provided on the exterior of the automobile 5700 eliminates blind areas and enhances safety.

Since the OSAI chip 400 described in Embodiment 2 can be used as a component of artificial intelligence, this computer can be used for an automatic driving system of the automobile 5700, for example. The computer can also be used for a system for navigation, risk prediction, or the like. The display device may display navigation information, risk prediction information, or the like.

Although the automobile is described as an example of a moving vehicle in the above, the moving vehicle is not limited to the automobile. Examples of the moving vehicle include a train, a monorail train, a ship, and a flying object (a helicopter, an unmanned aircraft (drone), an airplane, or a rocket). These moving vehicles can include a system utilizing artificial intelligence with the use of the computer of one embodiment of the present invention.

[Camera]

The OSAI chip 400 described in Embodiment 2 can be used in a camera.

FIG. 1 illustrates a digital camera 6240 as an example of an imaging device. The digital camera 6240 includes a housing 6241, a display portion 6242, operation buttons 6243, a shutter button 6244, and the like, and an attachable lens 6246 is attached to the digital camera 6240. Although the lens 6246 of the digital camera 6240 illustrated here is detachable from the housing 6241 for replacement, the lens 6246 may be incorporated into the housing 6241. A stroboscope, a viewfinder, or the like may be additionally provided in the digital camera 6240.

The digital camera 6240 including the OSAI chip 400 described in Embodiment 2 can have low power consumption. Furthermore, heat generation from a circuit can be reduced owing to low power consumption; therefore, the influence of heat generation on the circuit, the peripheral circuit, and the module can be reduced.

Furthermore, when the OSAI chip 400 described in Embodiment 2 is used for the digital camera 6240, the digital camera 6240 including artificial intelligence can be obtained. Utilizing the artificial intelligence enables the digital camera 6240 to have a function of automatically recognizing a subject such as a face or an object, a function of adjusting a focus on the subject, a function of automatically using a flash in accordance with environments, a function of toning a taken image, and the like.

[Video Camera]

The OSAI chip 400 described in Embodiment 2 can be used in a video camera.

FIG. 1 illustrates a video camera 6300 as an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of artificial intelligence, the video camera 6300 can perform the pattern recognition by artificial intelligence in encoding of the images. The pattern recognition is utilized to calculate a difference in the human, the animal, the object, and the like between continuously taken image data, so that the data can be compressed.

[Extension Device for PC]

The OSAI chip 400 described in Embodiment 2 can be used for a calculator such as a PC (Personal Computer) and an extension device for an information terminal.

Figure 2A:
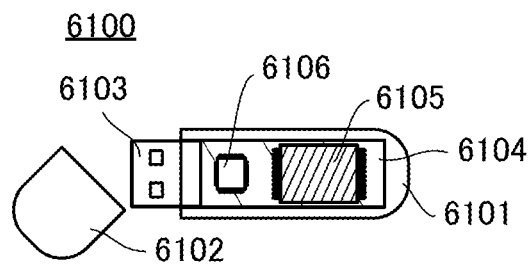
FIGS. 2A to 2C Diagrams illustrating examples of electronic devices and systems.

FIG. 2(A) illustrates, as an example of the extension device, a portable extension device 6100 that includes a chip capable of arithmetic processing and is externally provided on a PC. The extension device 6100 can perform arithmetic processing using the chip when connected to the PC with a universal serial bus (USB) or the like. FIG. 2(A) illustrates the portable extension device 6100; however, the extension device of one embodiment of the present invention is not limited thereto. For example, a relatively large extension device including a cooling fan or the like may be provided.

The expansion device 6100 includes a housing 6101, a cap 6102, a USB connector 6103, and a substrate 6104. The substrate 6104 is held in the housing 6101. The substrate 6104 is provided with a circuit for driving the OSAI chip 400 and the like. For example, a chip 6105 (e.g., an OSAI chip or a memory chip) and a controller chip 6106 are attached to the substrate 6104. The USB connector 6103 functions as an interface for connection to an external device.

The use of the extension device 6100 for the PC and the like can increase the arithmetic processing properties of the PC. Thus, a PC with insufficient processing capability can perform arithmetic operation of artificial intelligence, moving image processing, and the like.

[Broadcasting System]

The OSAI chip 400 described in Embodiment 2 can be used in a broadcasting system.

Figure 2B:
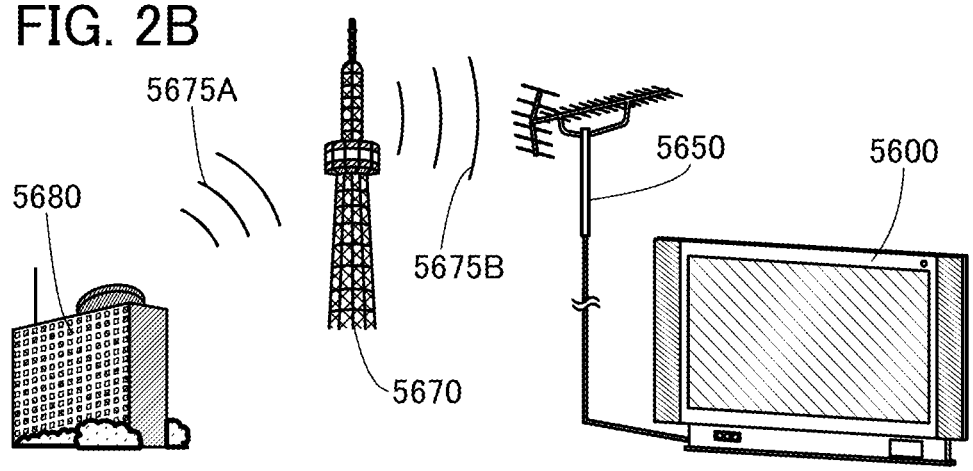

FIG. 2(B) schematically illustrates data transmission in a broadcasting system. Specifically, FIG. 2(B) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra-High Frequency) antenna is illustrated as the antenna 5650 in FIG. 2(B), a BS/110° CS antenna, a CS antenna, or the like can also be used.

A radio wave 5675A and a radio wave 5675B are broadcast signals for terrestrial broadcasting, and a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting illustrated in FIG. 2(B) and may be satellite broadcasting using an artificial satellite, data broadcasting using an optical line, or the like.

The above-described broadcasting system may utilize artificial intelligence by including the OSAI chip 400 described in Embodiment 2. When the broadcast data is transmitted from the broadcast station 5680 to the TV 5600 of each household, the broadcast data is compressed by an encoder. The antenna 5650 receives the compressed broadcast data, and then the compressed broadcast data is decompressed by a decoder in the receiving device in the TV 5600. With the use of the artificial intelligence, for example, display pattern included in the image can be recognized in motion compensation prediction, which is one of the compressing methods of the encoder. In addition, in-frame prediction can also be performed utilizing artificial intelligence, for example. Furthermore, for example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting which needs a large amount of broadcast data.

As an application of artificial intelligence in the TV 5600, a recording device including artificial intelligence may be provided in the TV 5600. With such a structure, the artificial intelligence in the recording device can learn the user's preference, so that TV programs that suit for the user's preference can be recorded automatically.

[Authentication System]

The OSAI chip 400 described in Embodiment 2 can be used in an authentication system.

Figure 2C:
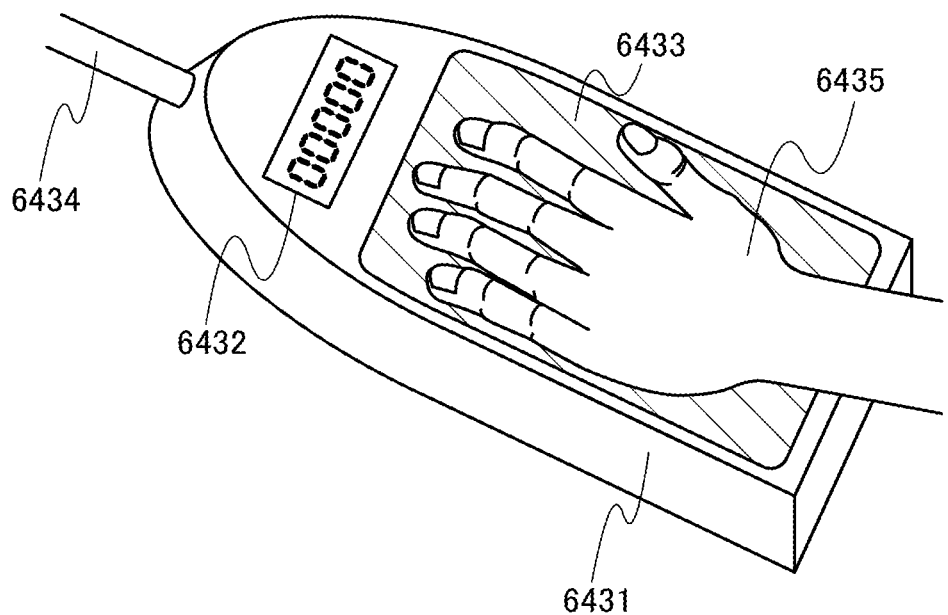

FIG. 2(C) illustrates a palm print authentication device including a housing 6431, a display portion 6432, a palm print reading portion 6433, and a wiring 6434.

In FIG. 2(D), a palm print of a hand 6435 is obtained by a palm print authentication device. The obtained palm print is subjected to the pattern recognition utilizing artificial intelligence, so that personal authentication of the palm print can be performed. Thus, a system that performs highly secure authentication can be constructed. Without limitation to the palm print authentication device, the authentication system of one embodiment of the present invention may be a device that performs biological authentication by obtaining biological information of fingerprints, veins, faces, iris, voice prints, genes, physiques, or the like.

[Information Terminal 2]

Figure 3A:
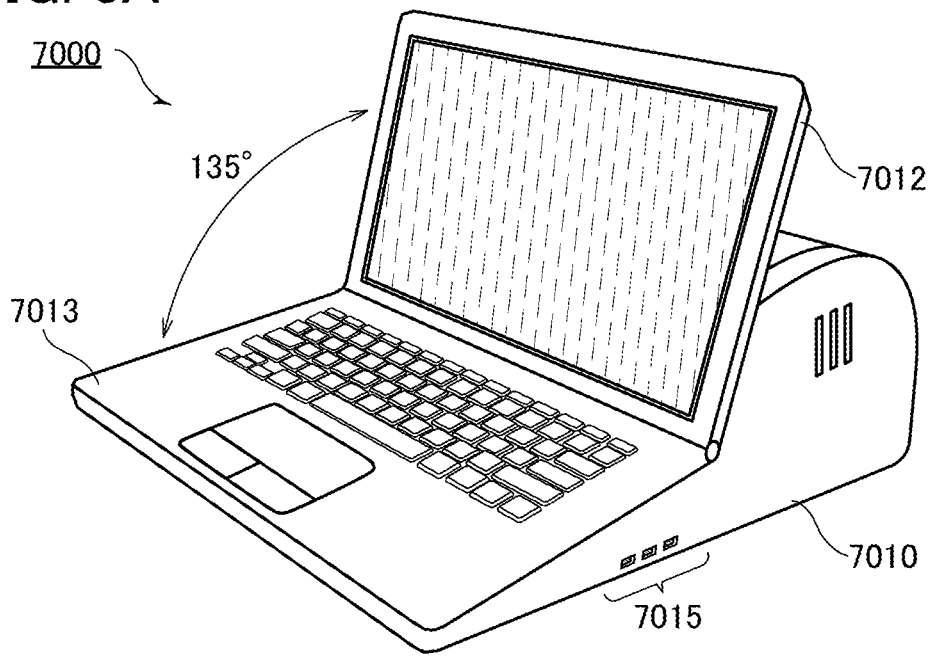
FIGS. 3A and 3B Diagrams illustrating an example of an electronic device.

FIG. 3 illustrates an example of an information terminal 7000. As illustrated in FIG. 3(A), the information terminal 7000 includes a housing 7010, a monitor portion 7012, a keyboard 7013, and a port 7015. The keyboard 7013 and the port 7015 are provided on the housing 7010. Examples of the port 7015 include a USB port, a LAN port, an HDMI (High-Definition Multimedia Interface) (registered trademark) port, and the like.

Figure 3B:
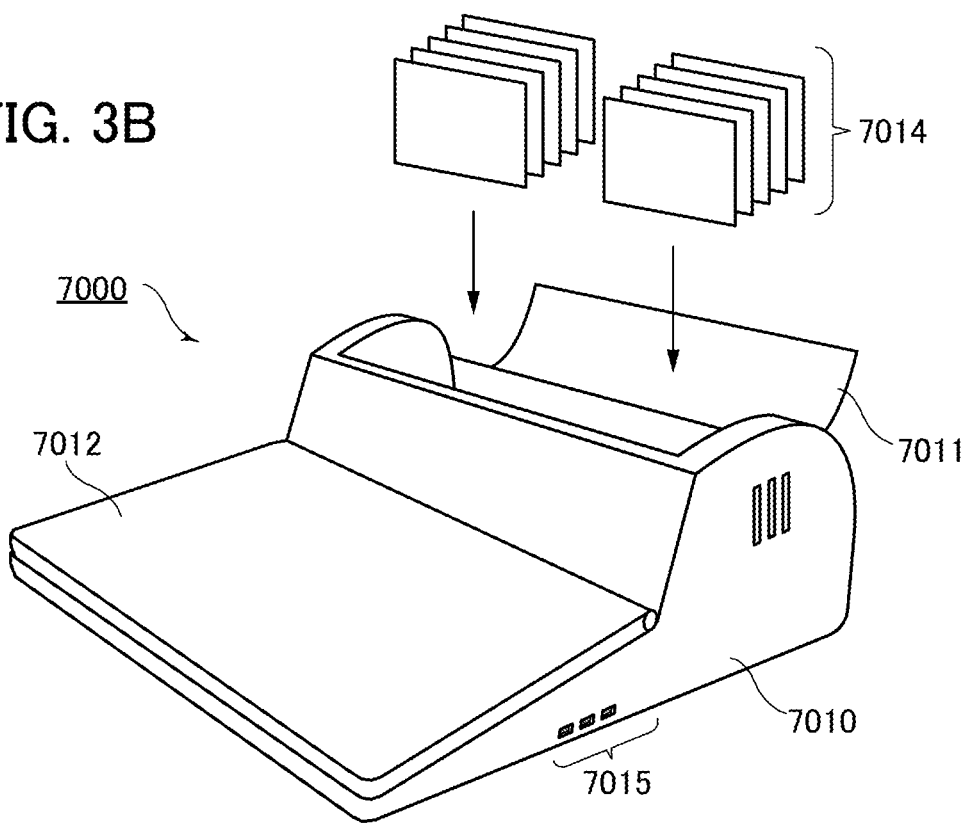

The monitor portion 7012 is attached to the housing 7010 so as to be opened and closed. FIG. 3(A) illustrates a state in which the monitor portion 7012 is opened and FIG. 3(B) illustrates a state in which the monitor portion 7012 is closed. For example, the maximum angle at which the monitor portion 7012 can be opened is approximately 135°.

As illustrated in FIG. 3(B), a cover 7011 is provided on the housing 7010 so as to be opened and closed. A plurality of PC cards 7014 are detachably incorporated in the housing 7010. The PC card 7014 can be, for example, an expansion card on which an OSAI chip is mounted. A device for cooling the PC card 7014 or a device for dissipating heat may be provided inside the housing 7010. The cover 7011 can be opened and the PC cards 7014 can be exchanged; thus, the information terminal 7000 has high extensibility. A plurality of expansion cards on which OSAI chips are mounted are incorporated in the information terminal 7000 as the PC cards 7014, whereby various graphic processing and arithmetic operation of artificial intelligence can be performed at high speed.

<Parallel Computing Machine>

A plurality of calculators including OSAI chips form a cluster, whereby a parallel computing machine can be formed.

Figure 4A:
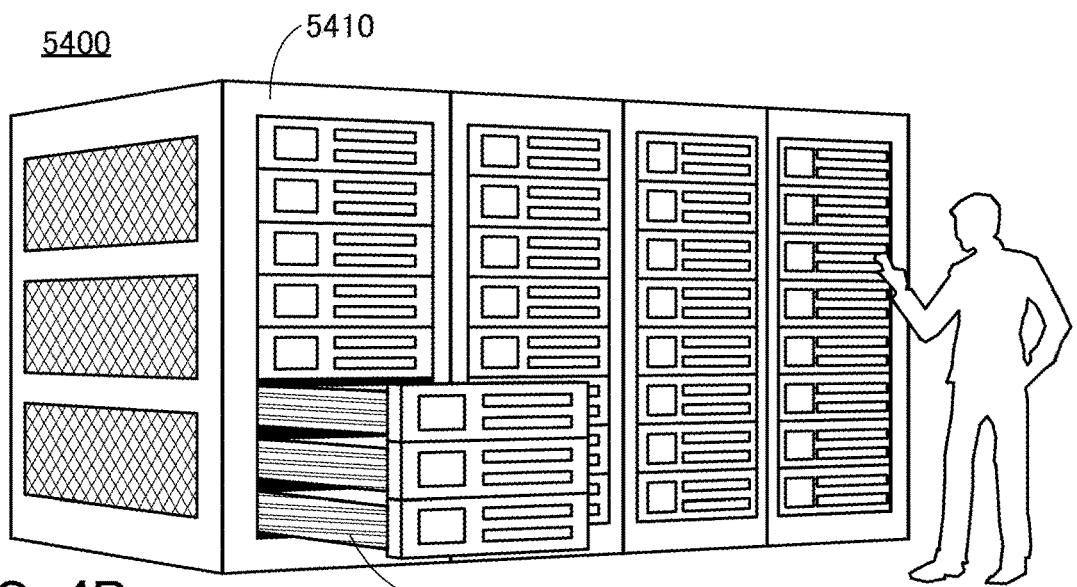
FIGS. 4A to 4C Diagrams illustrating examples of a parallel computing machine, a calculator, and a PC card.

FIG. 4(A) illustrates a large-sized parallel computing machine 5400. In the parallel computing machine 5400, a rack 5410 stores a plurality of rack-mount calculators 5420.

Figure 4B:
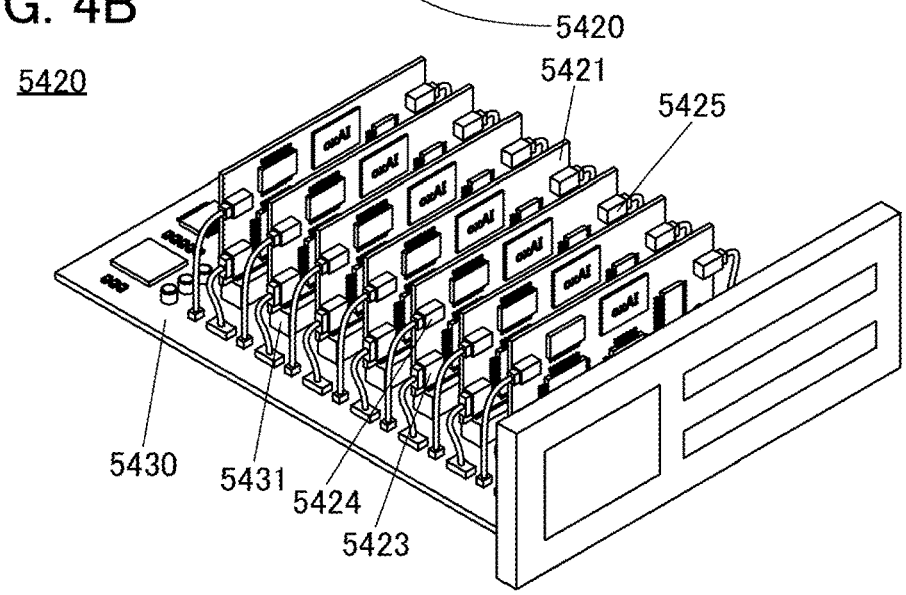

The calculator 5420 can have a structure illustrated in a perspective view of FIG. 4(B), for example. In FIG. 4(B), the calculator 5420 includes a motherboard 5430, and the motherboard 5430 includes a plurality of slots 5431, a plurality of connection terminals 5432, and a plurality of connection terminals 5433. In the slot 5431, a PC card 5421 is inserted. In addition, the PC card 5421 includes a connection terminal 5423, a connection terminal 5424, and a connection terminal 5425, each of which is connected to the motherboard 5430.

Figure 4C:
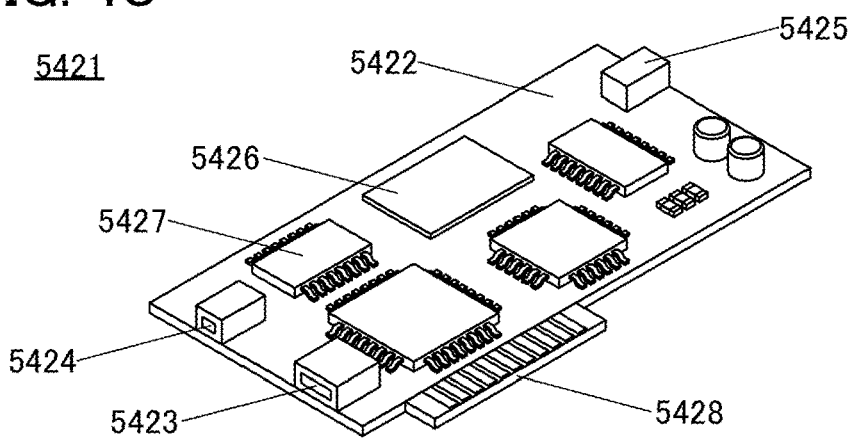

The PC card 5421 is a processing board on which the OSAI chip described in Embodiment 2, the arithmetic circuit MACF described in Embodiment 3, and the like are provided. For example, FIG. 4(C) illustrates a structure in which the PC card 5421 includes a board 5422 and the board 5422 includes the connection terminal 5423, the connection terminal 5424, the connection terminal 5425, a chip 5426, a chip 5427, and a connection terminal 5428. Note that although chips other than the chip 5426 and the chip 5427 are illustrated in FIG. 4(C), the description of the chip 5426 and the chip 5427 described below is referred to for these chips.

The connection terminal 5428 has a shape with which the connection terminal 5428 can be inserted in the slot 5431 of the motherboard 5430, and the connection terminal 5428 serves as an interface for connecting the PC card 5421 to the motherboard 5430. As a standard of the connection terminal 5428, a PCIe or the like can be given, for example.

The connection terminal 5423, the connection terminal 5424, and the connection terminal 5425 can each serve as, for example, an interface that supplies power, inputs a signal, or the like with respect to the PC card 5421. Furthermore, the connection terminals can each serve as, for example, an interface that performs output of a signal calculated by the PC card 5421 or the like. As standards of the connection terminal 5423, the connection terminal 5424, and the connection terminal 5425, for example, USB (Universal Serial Bus), SATA (Serial ATA), SCSI (Small Computer System Interface), and the like are given. In the case where image signals are output from the connection terminal 5423, the connection terminal 5424, and the connection terminal 5425, HDMI (registered trademark) and the like are given as their standards.

The chip 5426 includes a terminal (not shown) that performs input/output of signals, and when the terminal is inserted in a socket (not shown) of the PC card 5421, the chip 5426 and the PC card 5421 can be electrically connected to each other. As the chip 5426, the OSAI chip described in the above embodiment can be used, for example.

The chip 5427 includes a plurality of terminals, and when the terminals are reflow-soldered, for example, to wirings included in the PC card 5421, the chip 5427 and the PC card 5421 can be electrically connected to each other. As the chip 5427, a memory device, an FPGA (Field Programmable Gate Array), a CPU, and the like can be given as examples.

By applying the OSAI chip to the calculator 5420 of the parallel computing machine 5400 illustrated in FIG. 4(A), a large-scale calculation, which is necessary for learning and inference of artificial intelligence, can be performed, for example.

<Server and System Including Server>

The above-mentioned calculator or parallel computing machine can be applied to, for example, a server that functions on a network. In addition, a system including the server can be formed.

Figure 5A:
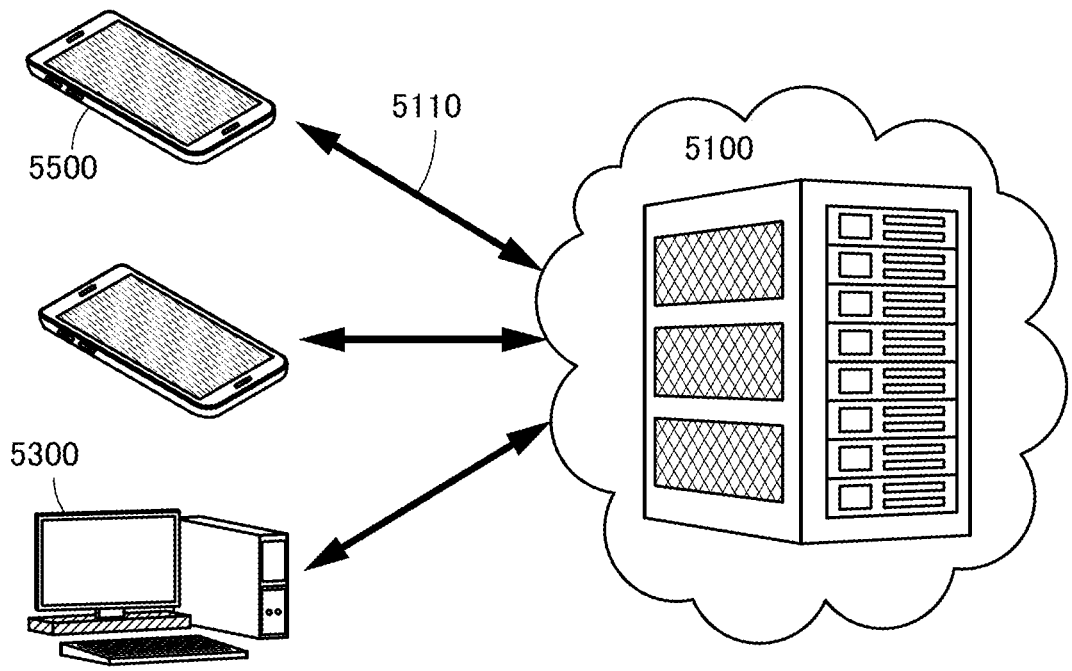
FIGS. 5A and 5B Diagrams illustrating structure examples of systems.

FIG. 5(A) schematically illustrates communication between a server 5100 to which the OSAI chip is applied and the information terminal 5500 and the desktop information terminal 5300, which are described above. Note that in FIG. 5(A), communication 5110 is shown as a situation for the communication.

With this structure, a user can access to the server 5100 with the information terminal 5500, the desktop information terminal 5300, or the like. Then, the user can receive a service provided by an administrator of the server 5100 through the communication 5110 via the Internet. As the service, for example, an electronic mail, an SNS (Social Networking Service), an online software, cloud storage, a navigation system, a translation system, an Internet game, online shopping, financial transaction for stocks, exchange, credits, and the like, reservation for public facilities, commercial facilities, accommodation, hospitals, and the like, viewing Internet programs, talks, and lectures, and the like are given.

In particular, by applying the computer of one embodiment of the present invention to the server 5100, artificial intelligence can be utilized in the above-described services. For example, adopting artificial intelligence in a navigation system may enable the system to provide flexible guidance to a destination in consideration of a traffic congestion situation, a train running status, or the like. As another example, adopting artificial intelligence in a translation system may enable the system to translate unique expressions such as dialects and slangs appropriately. As another example, using artificial intelligence in a reservation system for hospitals and the like may enable the system to introduce an appropriate hospital, clinic, or the like by judging from a user's symptom, degree of an injury, or the like.

When the user intends to develop artificial intelligence, the user can access the server 5100 via the Internet and perform the development on the server 5100. This is preferable when the processing capacity is insufficient with the information terminal 5500, the desktop information terminal 5300, or the like in the user's possession or when a development environment cannot be constructed with the information terminal 5500, the desktop information terminal 5300, or the like, for example.

Although FIG. 5(A) illustrates an example of the system configured with the information terminals and the server 5100 as a system including a server, another example may be a system configured with an electronic device other than the information terminal and the server 5100. That is, an embodiment may be IoT (Internet of Things), in which electronic devices are connected to the Internet.

Figure 5B:
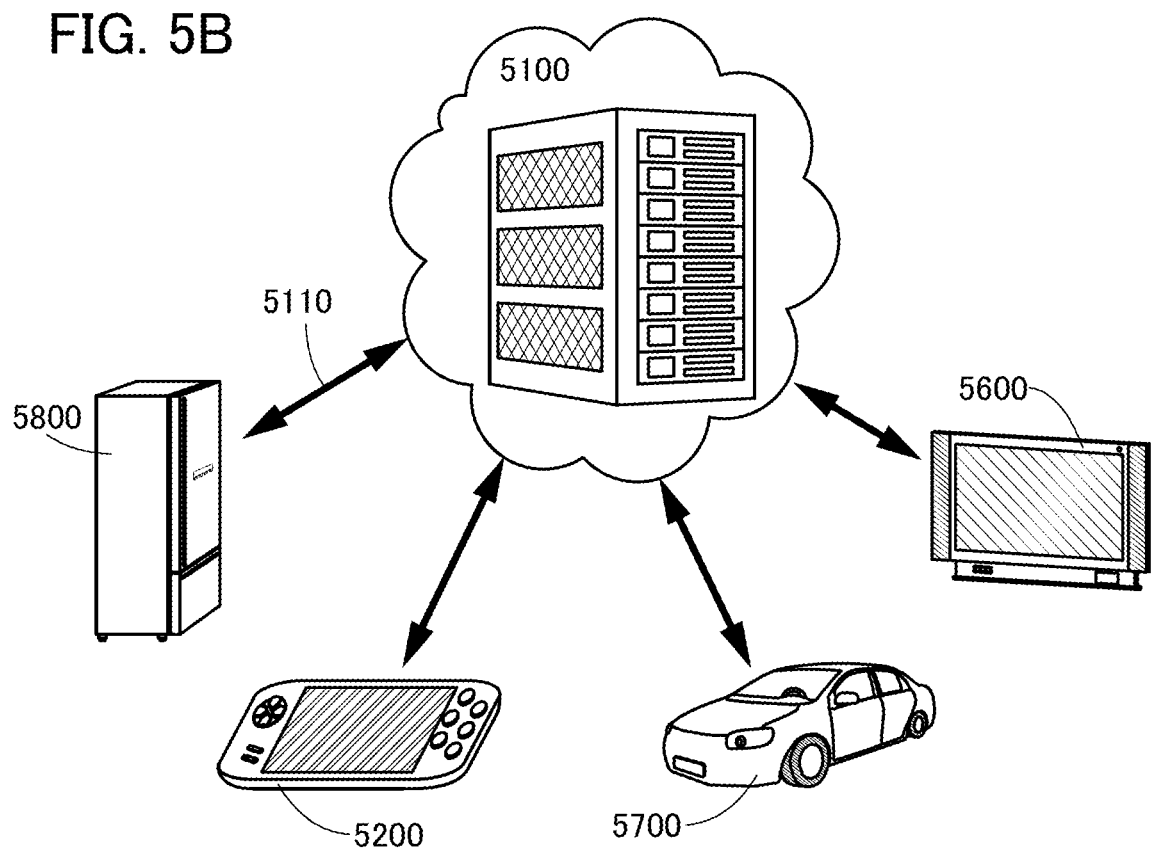

FIG. 5(B) schematically illustrates communication between the electronic devices illustrated in FIG. 1 (the electric refrigerator-freezer 5800, the portable game machine 5200, the automobile 5700, and the TV 5600) and the server 5100. Note that FIG. 5(B) illustrates the communication 5110 as a situation for the communication.

In the case where artificial intelligence is applied to each of the electronic devices described with reference to FIG. 1, the server 5100 can perform arithmetic operation needed for the artificial intelligence, as illustrated in FIG. 5(B). For example, input data needed for the arithmetic operation is transmitted from one of the electronic devices to the server 5100, output data is calculated by the artificial intelligence included in the server 5100 on the basis of the input data, and the output data is transmitted from the server 5100 to the one electronic device through the communication 5110. Thus, the electronic device can operate on the basis of the data output from the artificial intelligence.

The electronic devices illustrated in FIG. 5(B) are examples, and a structure in which an electronic device not illustrated in FIG. 5(B) is connected to the server 5100 to communicate mutually in the above-described manner may also be employed.

The electronic device and its functions, an application example of the artificial intelligence and its effects, and the like described in this embodiment can be combined as appropriate with the description of another electronic device.

This embodiment can be combined with the description of the other embodiments as appropriate.

Embodiment 2

In this embodiment, an IC chip capable of performing arithmetic processing of artificial intelligence will be described. Note that in this specification and the like, artificial intelligence formed using OS transistors is denoted as OSAI, and an IC chip capable of arithmetic processing of the OSAI is called an OSAI chip.

Figure 6:
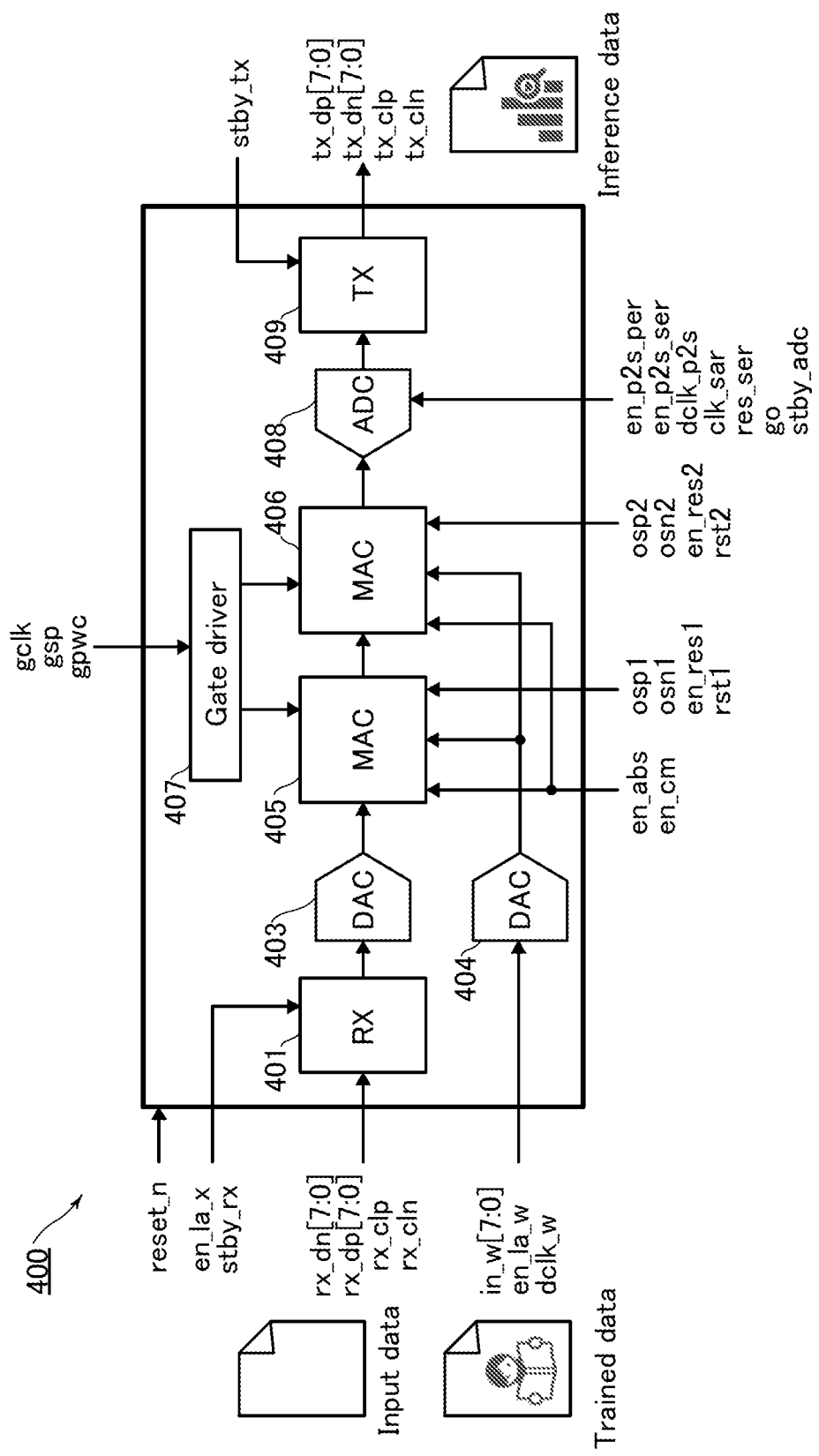
FIG. 6 A functional block diagram illustrating a configuration example of an OSAI chip.

A block diagram of a configuration example of the OSAI chip is shown in FIG. 6. The OSAI chip 400 shown in FIG. 6 includes a receiver (RX) 401, digital-analog converters (DAC) 403 and 404, arithmetic circuit (MAC) arrays 405 and 406, a gate driver 407, an analog-digital converter (ADC) 408, and a transmitter (TX) 409.

A data transmission method of the OSAI chip 400 is a differential transmission method. For example, an LVDS (Low Voltage Differential Signaling) receiver is used as the receiver 401, and an LVDS transmitter is used as the transmitter 409.

A reset signal reset_n is a signal for resetting the OSAI chip 400.

Data in_w[7:0] is trained data. An example is an 8-bit digital signal that represents a weight coefficient. The DAC 404 converts the data in_w[7:0] into analog data in accordance with an enable signal en_la_w and a clock signal dclk_w. The gate driver 407 controls writing of analog data to the MAC arrays 405 and 406. A clock signal gclk, a pulse width control signal gpwc, and a start pulse signal gsp are input to the gate driver 407.

Data processed by the OSAI chip 400 is 8-bit digital data and is input by a differential transmission method. For example, an LVDS receiver is used as the receiver 401. The receiver 401 converts input data rx_dp[7:0] and rx_dn[7:0] into single-ended 8-bit data in accordance with differential clock signals rx_clp and rx_cln. The DAC 403 converts this 8-bit data into analog data. Analog data output from the DAC 404 is written to the MAC array 405 successively.

<MAC Arrays 405 and 406>

In the case where arithmetic operation of artificial intelligence, for example, a neural network, is performed, a multiplier circuit that performs multiplication of a signal and a weight coefficient, an adder circuit that performs addition of the multiplication results, a function circuit that outputs a value of a function corresponding to the added value, and the like are necessary. The MAC arrays 405 and 406 each include a circuit that performs product-sum operation, functional calculation, and the like, and a configuration of the arithmetic circuit MACF in FIG. 7, which is described in Embodiment 3, may be employed for the MAC arrays 405 and 406. In particular, in the arithmetic circuit MACF, analog data can be used as input data and output data.

Furthermore, the arithmetic circuit MACF has a function of a nonvolatile local memory that retains a weight coefficient. Thus, the OSAI chip 400 in which the arithmetic circuit MACF is used for the MAC arrays 405 and 406 can achieve massively parallel arithmetic operation that uses an extremely small number of transistors as compared with a GPU. A reduction in the number of transistors leads to reductions in size and power consumption of the OSAI chip 400.

Figure 7:
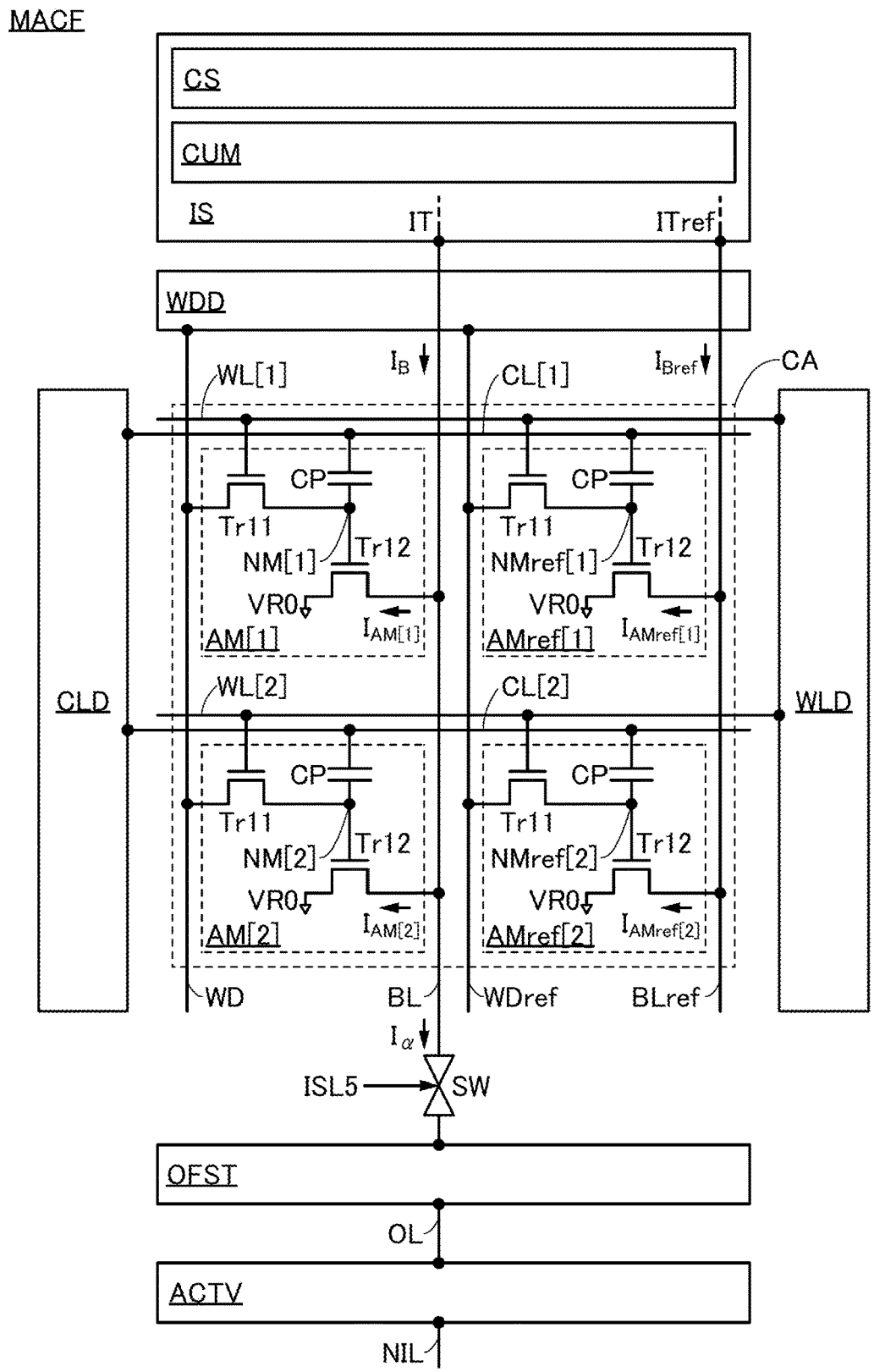
FIG. 7 A circuit diagram illustrating a configuration example of an arithmetic circuit.

The gate driver 407 in FIG. 6 corresponds to a circuit WLD, which is described in Embodiment 3, of the arithmetic circuit MACF in FIG. 7.

An enable signal en_cm shown in FIG. 6 is an enable signal for a current source of the MAC arrays 405 and 406. The current source described here can be a current supply circuit IS which is described in Embodiment 3, and the enable signal can be a signal supplied to a wiring ISL0 to a wiring ISL5 and the like. An enable signal en_abs is an enable signal for an offset circuit of the MAC arrays 405 and 406; signals osp1, osn1, and en_res1 are control signals for the offset circuit of the MAC array 405, and signals osp2, osn2, and en_res2 are control signals for the offset circuit of the MAC array 406. Note that the offset circuit can be a circuit OFST, which is described in Embodiment 3, of the arithmetic circuit MACF in FIG. 7.

<ADC 408 and TX 409>

Analog data output from the MAC array 406 is input to the ADC 408 in parallel. The ADC 408 includes a register in an output stage in order to perform serial-parallel conversion. The ADC 408 outputs a 1-channel 8-bit digital data.

Signals clk_sar, res_sar, go, and stby_adc are a clock signal, a reset signal, an enable signal, and a standby signal, respectively, for the ADC 408. Signals dclk_p2s, en_p2s_per, and en_p2s_ser are a clock signal, a latch signal, and an output enable signal, respectively, for the register. Analog data from the MAC array 406 is input to the ADC 408, and 8-bit digital data is output to the transmitter 409. A signal stby_tx is a standby signal for the transmitter 409.

The transmitter 409 converts the 8-bit digital data into differential data tx_dp[7:0] and tx_dn[7:0] in accordance with the signal dclk_p2s and outputs them, and converts the signal dclk_p2s into differential clock signals tx_clp and tx_cln and outputs them. The differential data tx_dp[7:0] and tx_dn[7:0] are inference data which is calculated by the OSAI chip 400.

Since the input data and the output data of the MAC arrays 405 and 406 are analog data, the number of wirings of the MAC arrays 405 and 406 can be significantly reduced as compared with the case where the input data and the output data are digital data. In addition, although the details are described in Embodiment 3, since the arithmetic circuit MACF has both a multiplication function and a function of retaining weight coefficient data, data reading is not performed at the time of arithmetic operation. That is, with use of the arithmetic circuit MACF for the MAC arrays 405 and 406, the MAC arrays 405 and 406 substantially have no time penalties and no electric power penalties due to data transmission and reception.

A GPU is known as a processor having parallel processing architecture. Also in the GPU, data transmission and reception between an arithmetic unit and a memory unit is a bottleneck in arithmetic efficiency, as in the CPU. In contrast, the OSAI chip 400 does not have such a problem.

In addition, although the details are described in Embodiment 3, the arithmetic circuit MACF can perform intermittent driving in which arithmetic operation is performed when needed. Thus, the power consumption of the arithmetic circuit MACF can be reduced as in the case where the operating frequency of the arithmetic circuit MACF is lowered.

Since the OSAI chip 400 has the parallel processing architecture as described above, the OSAI chip 400 can be used as a GPU in some cases. In particular, in the case where a GPU includes the arithmetic circuit MACF, intermittent driving can be performed in the GPU; thus, power supply to the GPU can be stopped at the time when the arithmetic processing is not performed. Such a GPU capable of performing intermittent driving can be called Noff GPU (Normally off GPU).

The components of the OSAI chip 400 may be provided in the same chip as the CPU. By using the OSAI chip 400 as a GPU, a GPU provided in the CPU (integrated GPU, iGPU) can be configured.

Note that this embodiment can be combined with other embodiments in this specification as appropriate.

Embodiment 3

In this embodiment, a configuration of an arithmetic circuit, which is a semiconductor device of one embodiment of the present invention, and an operation example thereof will be described.

FIG. 7 illustrates a configuration example of an arithmetic circuit. The arithmetic circuit MACF illustrated in FIG. 7 is a circuit that performs product-sum operation of first data retained in a memory cell described later and second data input to the memory cell, and outputs the value of an activation function in accordance with the result of the product-sum operation. Note that the first data and the second data can be analog data or multilevel data (discrete data).

The arithmetic circuit MACF illustrated in FIG. 7 includes a current supply circuit IS, a circuit WDD, a circuit WLD, a circuit CLD, a circuit OFST, an activation function circuit ACTV, a memory cell array CA, and an analog switch SW.

The memory cell array CA includes a memory cell AM[1], a memory cell AM[2], a memory cell AMref[1], and a memory cell AMref[2]. The memory cell AM[1] and the memory cell AM[2] each have a function of retaining the first data, and the memory cell AMref[1] and the memory cell AMref[2] each have a function of retaining reference data that is needed to perform product-sum operation. That is, the memory cell array CA also serves as a nonvolatile local memory. By providing the memory portion that retains data in the circuit that performs arithmetic operation in this manner, the time for reading out data necessary for the calculation from the memory portion outside of the arithmetic circuit and transmitting it to the arithmetic circuit can be omitted. Note that the reference data can also be analog data or multilevel data (discrete data), like the first data and the second data.

The memory cell array CA in FIG. 7 has a configuration in which memory cells are arranged in a matrix of two rows and two columns; however, the memory cell array CA may have a configuration in which memory cells are arranged in a matrix of three or more rows and three or more columns. In the case where not product-sum operation but multiplication is performed, the memory cell array CA may have a configuration in which memory cells are arranged in a matrix of one row and two or more columns.

The memory cell AM[1], the memory cell AM[2], the memory cell AMref[1], and the memory cell AMref[2] each include a transistor Tr11, a transistor Tr12, and a capacitor CP. Although not illustrated in FIG. 7, the transistor Tr11 and/or the transistor Tr12 each may include a back gate.

Note that the transistor Tr11 is preferably an OS transistor. In addition, it is further preferable that a channel formation region of the transistor Tr11 be an oxide containing at least one of indium, the element M (as the element M, aluminum, gallium, yttrium, tin, or the like can be given), and zinc. It is further preferable that the transistor Tr11 have a structure of the transistor described in Embodiment 4, in particular.

With the use of an OS transistor as the transistor Tr11, the leakage current of the transistor Tr11 can be suppressed, so that a product-sum operation circuit with high computation accuracy can be obtained in some cases. Furthermore, with the use of an OS transistor as the transistor Tr11, the amount of leakage current from a retention node to a writing word line can be extremely small when the transistor Tr11 is in a non-conduction state. In other words, the frequency of refresh operation of the potential at the retention node can be reduced; thus, power consumption of the product-sum operation circuit can be reduced.

The use of an OS transistor also as the transistor Tr12 allows the transistor Tr12 to be formed concurrently with the transistor Tr11, leading to a reduction in the number of manufacturing steps for the arithmetic circuit, in some cases. A channel formation region of the transistor Tr12 may be amorphous silicon, polycrystalline silicon, or the like instead of an oxide.

In each of the memory cell AM[1], the memory cell AM[2], the memory cell AMref[1], and the memory cell AMref[2], a first terminal of the transistor Tr11 is electrically connected to a gate of the transistor Tr12 and a first terminal of the capacitor CP. A first terminal of the transistor Tr12 is electrically connected to a wiring VR0.

In the memory cell AM[1], a second terminal of the transistor Tr11 is electrically connected to a wiring WD, and a gate of the transistor Tr11 is electrically connected to a wiring WL[1]. A second terminal of the transistor Tr12 is electrically connected to a wiring BL, and a second terminal of the capacitor CP is electrically connected to a wiring CL[1]. In FIG. 7, in the memory cell AM[1], a connection portion of the first terminal of the transistor Tr11, and the gate of the transistor Tr12 is a node NM[1]. In addition, current that flows from the wiring BL to the second terminal of the transistor Tr12 is $I_{AM[1]}$.

In the memory cell AM[2], a second terminal of the transistor Tr11 is electrically connected to the wiring WD, and a gate of the transistor Tr11 is electrically connected to a wiring WL[2]. A second terminal of the transistor Tr12 is electrically connected to the wiring BL, and a second terminal of the capacitor CP is electrically connected to a wiring CL[2]. In FIG. 7, in the memory cell AM[2], a connection portion of the first terminal of the transistor Tr11, and the gate of the transistor Tr12 is a node NM[2]. In addition, current that flows from the wiring BL to the second terminal of the transistor Tr12 is $I_{AM[2]}$.

In the memory cell AMref[1], a second terminal of the transistor Tr11 is electrically connected to a wiring WDref, and a gate of the transistor Tr11 is electrically connected to the wiring WL[1]. A second terminal of the transistor Tr12 is electrically connected to a wiring BLref, and a second terminal of the capacitor CP is electrically connected to the wiring CL[1]. In FIG. 7, in the memory cell AMref[1], a connection portion of the first terminal of the transistor Tr11, and the gate of the transistor Tr12 is a node NMref[1]. In addition, current that flows from the wiring BLref to the second terminal of the transistor Tr12 is $I_{AMref[1]}$.

In the memory cell AMref[2], a second terminal of the transistor Tr11 is electrically connected to the wiring WDref, and a gate of the transistor Tr11 is electrically connected to the wiring WL[2]. A second terminal of the transistor Tr12 is electrically connected to the wiring BLref, and a second terminal of the capacitor CP is electrically connected to the wiring CL[2]. In FIG. 7, in the memory cell AMref[2], a connection portion of the first terminal of the transistor Tr11, and the gate of the transistor Tr12 is a node NMref[2]. In addition, current that flows from the wiring BLref to the second terminal of the transistor Tr12 is $I_{AMref[2]}$.

The node NM[1], the node NM[2], the node NMref[1], and the node NMref[2] described above function as retention nodes of their respective memory cells.

The wiring VR0 is a wiring for supplying current between the first terminal and the second terminal of the transistor Tr12 in each of the memory cell AM[1], the memory cell AM[2], the memory cell AMref[1], and the memory cell AMref[2]. Thus, the wiring VR0 functions as a wiring for supplying a predetermined potential. For example, a potential supplied by the wiring VR0 can be a ground potential or a potential lower than the ground potential, for example.

The current supply circuit IS includes a terminal IT and a terminal ITref. The terminal IT is electrically connected to a wiring BL, and the terminal ITref is electrically connected to the wiring BLref. The current supply circuit IS has a function of supplying current to the wiring BL and the wiring BLref. In this specification and the like, current flowing from the terminal IT of the current supply circuit IS to the wiring BL is denoted as $I_B$, and current flowing from the terminal ITref of the current supply circuit IS to the wiring BLref is denoted as $I_{Bref}$.

Figure 8:
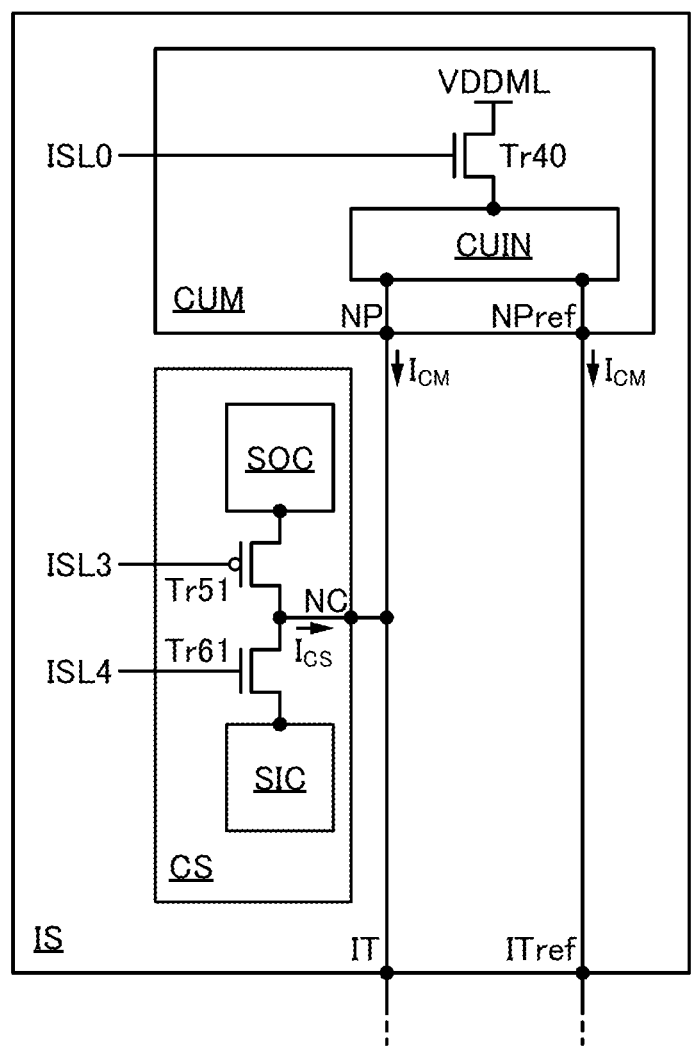
FIG. 8 A block diagram illustrating a configuration example of a current supply circuit included in an arithmetic circuit.

In this specification and the like, the current supply circuit IS includes, as an example, a bias circuit CS and a current mirror circuit CUM, and FIG. 8 illustrates the current supply circuit IS.

The current mirror circuit CUM includes a transistor Tr40, an internal circuit CUIN, a terminal NP, and a terminal NPref. Note that although the transistor Tr40 is illustrated as an re-channel transistor in FIG. 8, the transistor Tr40 may be a p-channel transistor.

A first terminal of the transistor Tr40 is electrically connected to the internal circuit CUIN, a second terminal of the transistor Tr40 is electrically connected to a wiring VDDML, and a gate of the transistor Tr40 is electrically connected to the wiring ISL0.

The wiring VDDML is a wiring for supplying a potential VDDM. The wiring ISL0 is a wiring for switching on/off states of the transistor Tr40.

The internal circuit CUIN is electrically connected to the terminal NP and the terminal NPref. In addition, the terminal NP is electrically connected to the terminal IT of the current supply circuit IS, and the terminal NPref is electrically connected to the terminal ITref of a current generation circuit IS.

The current mirror circuit CUM has a function of outputting current corresponding to a potential of the terminal NPref to each of the terminal NP and the terminal NPref through the internal circuit CUIN. Note that in FIG. 8, current output from the terminal NP and the terminal NPref is denoted as $I_{CM}$.

The current flows from the wiring VDDML to which the potential VDDM is supplied. Thus, the transistor Tr40 needs to be turned on in the case where the current mirror circuit CUM is driven. The transistor Tr40 can be turned on by supply of a high-level potential to the gate of the transistor Tr40; therefore, a high-level potential may be supplied to the wiring ISL0 to drive the current mirror circuit CUM.

The bias circuit CS includes a transistor Tr51, a transistor Tr61, a current source circuit SOC, a current sink circuit SIC, and a terminal NC. Note that in FIG. 8, the transistor Tr51 is a p-channel transistor and the transistor Tr61 is an n-channel transistor.

A first terminal of the transistor Tr51 is electrically connected to a first terminal of the transistor Tr61 and the terminal NC, a second terminal of the transistor Tr51 is electrically connected to the current source circuit SOC, and a gate of the transistor Tr51 is electrically connected to a wiring ISL3. A second terminal of the transistor Tr61 is electrically connected to the current sink circuit SIC, and a gate of the transistor Tr61 is electrically connected to a wiring ISL4.

The wiring ISL3 and the wiring ISL4 are wirings for switching on/off states of the transistor Tr51 and the transistor Tr61, respectively.

The terminal NC is electrically connected to the terminal NP and the terminal IT of the current generation circuit IS.

The current source circuit SOC has a function of supplying current to the terminal NC through the transistor Tr51. The current sink circuit SIC has a function of letting out current flowing from the terminal NP and the terminal IT to the terminal NC through the transistor Tr61. Note that in FIG. 8, the total sum of current flowing from the current source circuit SOC to the terminal NC and current flowing from the terminal NC to the current sink circuit SIC is denoted as $I_{CM}$. Although the direction of an arrow of $I_{CS}$ in FIG. 8 is the direction of current flowing from the first terminal of the transistor Tr51 to the terminal NC, the direction of current flowing from the terminal NC to the first terminal of the transistor Tr61 may be employed.

Current flowing from the current source circuit SOC to the terminal NC passes through the transistor Tr51. Therefore, in the case where the current source circuit SOC is driven, the transistor Tr51 needs to be turned on. The transistor Tr51 can be turned on by supply of a low-level potential to the gate of the transistor Tr51; therefore, a low-level potential may be supplied to the wiring ISL3 to drive the current source circuit SOC.

Current flowing from the current sink circuit SIC to the terminal NC passes through the transistor Tr61. Therefore, in the case where the current sink circuit SIC is driven, the transistor Tr61 needs to be turned on. The transistor Tr61 can be turned on by supply of a high-level potential to the gate of the transistor Tr61; therefore, a high-level potential may be supplied to the wiring ISL4 to drive the current sink circuit SIC.

Note that the circuit of one embodiment of the present invention is not limited to the current supply circuit IS illustrated in FIG. 8, and the circuit configuration can be changed as appropriate.

Figure 9:
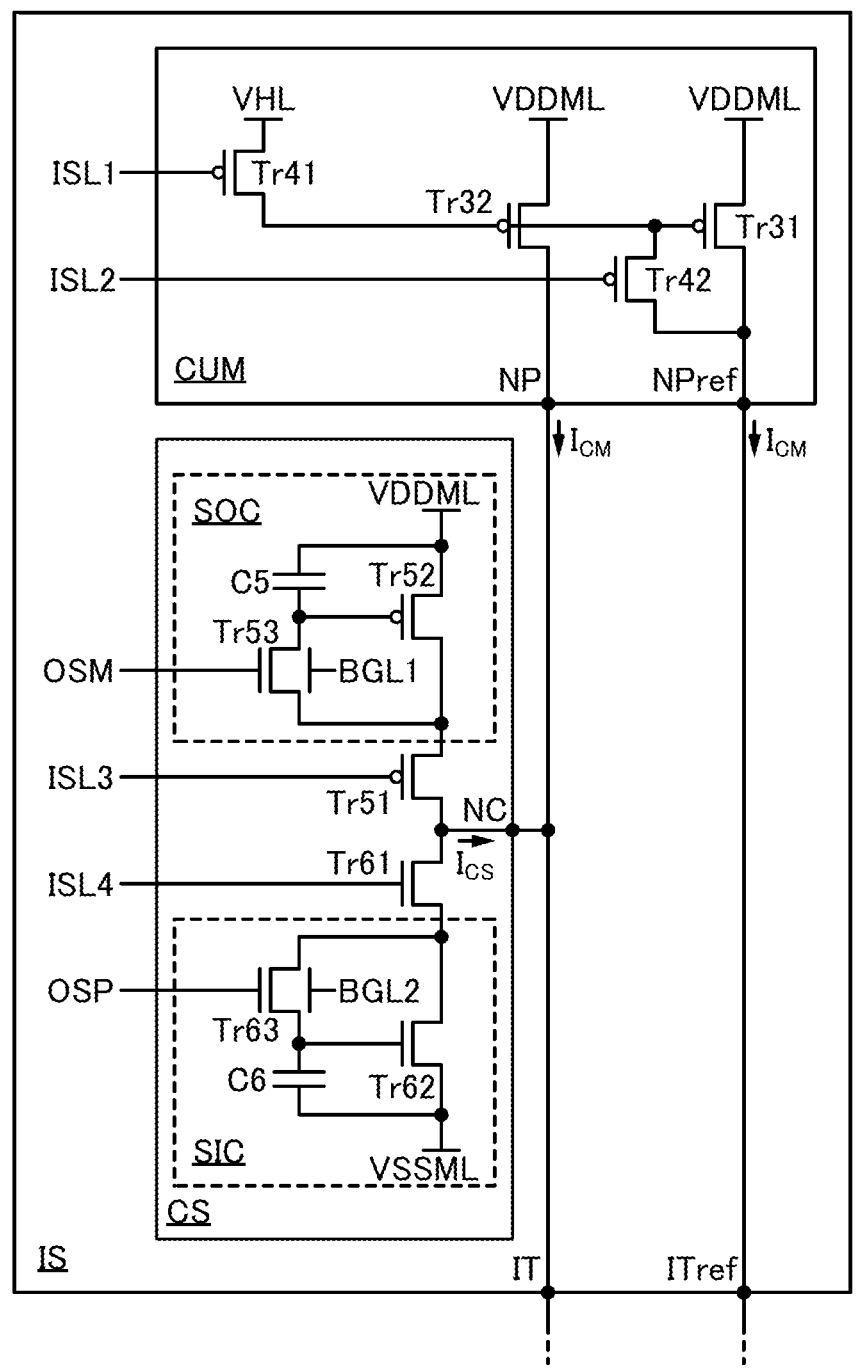
FIG. 9 A circuit diagram illustrating a configuration example of a current supply circuit included in an arithmetic circuit.

For example, FIG. 9 illustrates a configuration example of a circuit different from the current supply circuit IS illustrated in FIG. 8. Note that the description of portions in FIG. 9 which are in common with those in FIG. 8 is omitted.

The current mirror circuit CUM includes a transistor Tr31, a transistor Tr32, a transistor Tr41, and a transistor Tr42. Note that in FIG. 9, the transistor Tr31, the transistor Tr32, the transistor Tr41, and the transistor Tr42 are p-channel transistors.

A first terminal of the transistor Tr31 is electrically connected to a first terminal of the transistor Tr42 and the terminal NPref, a second terminal of the transistor Tr31 is electrically connected to the wiring VDDML, and a gate of the transistor Tr31 is electrically connected to a gate of the transistor Tr32, a first terminal of the transistor Tr41, and a second terminal of the transistor Tr42. A first terminal of the transistor Tr32 is electrically connected to the terminal NP, and a second terminal of the transistor Tr32 is electrically connected to the wiring VDDML.

A gate of the transistor Tr41 is electrically connected to a wiring ISL1, and a gate of the transistor Tr42 is electrically connected to a wiring ISL2. The wiring ISL1 and the wiring ISL2 are wirings for switching on/off states of the transistor Tr41 and the transistor Tr42, respectively. A second terminal of the transistor Tr41 is electrically connected to a wiring VHL. The wiring VHL is a wiring for supplying a potential VH, and the potential VH is a potential high enough to turn off the transistor Tr31 and the transistor Tr32.

Although the details of operation of the current mirror circuit CUM are described later, when the transistor Tr41 is off and the transistor Tr42 is on, the current mirror circuit CUM has functions of outputting current corresponding to a potential of the terminal Npref from the wiring VDDML to the terminal Npref through the transistor Tr31 and outputting current with the same amount as the current from the wiring VDDML to the terminal NP through the transistor Tr32.

In the bias circuit CS, the current source circuit SOC includes a transistor Tr52, a transistor Tr53, and a capacitor C5. The current sink circuit SIC includes a transistor Tr62, a transistor Tr63, and a capacitor C6. Note that in FIG. 9, the transistor Tr52 is a p-channel transistor, and the transistor Tr53, the transistor Tr62, and the transistor Tr63 are n-channel transistors. In FIG. 9, the transistor Tr53 and the transistor Tr63 are illustrated as transistors each including a back gate, and by application of a certain potential to the back gate, threshold voltage of the transistor including the back gate can be changed. Note that the transistor Tr53 and the transistor Tr63 may be transistors each including only a gate.

A second terminal of the transistor Tr51 is electrically connected to a first terminal of the transistor Tr52 and a first terminal of the transistor Tr53. A gate of the transistor Tr52 is electrically connected to a second terminal of the transistor Tr53 and a first terminal of the capacitor C5, a second terminal of the transistor Tr52 is electrically connected to a second terminal of the capacitor C5 and the wiring VDDML. The second terminal of the transistor Tr61 is electrically connected to a first terminal of the transistor Tr62 and a first terminal of the transistor Tr63. A gate of the transistor Tr62 is electrically connected to a second terminal of the transistor Tr63 and a first terminal of the capacitor C6, and a second terminal of the transistor Tr62 is electrically connected to a second terminal of the capacitor C6 and the wiring VSSML. In FIG. 9, a portion where the first terminal of the transistor Tr51, the first terminal of the transistor Tr61, and the terminal IT are connected is denoted as the terminal NC.

The wiring VSSML is a wiring for supplying a potential VSSM. Note that the potential VSSM is a potential lower than the potential VDDM.

A gate of the transistor Tr53 is electrically connected to a wiring OSM, and the back gate of the transistor Tr53 is electrically connected to a wiring BGL1. A gate of the transistor Tr63 is electrically connected to a wiring OSP, and the back gate of the transistor Tr63 is electrically connected to a wiring BGL2.

Although the details of operation of the bias circuit CS are described later, when the transistor Tr51 is on and the transistor Tr53 is off, the current source circuit SOC has a function of supplying current corresponding to a potential of the first terminal of the capacitor C5 from the wiring VDDML to the first terminal of the transistor Tr51 through the transistor Tr52. When the transistor Tr61 is on and the transistor Tr63 is off, the current sink circuit SIC has a function of letting out current corresponding to a potential of the first terminal of the capacitor C6 from the first terminal of the transistor Tr61 to the wiring VSSML through the transistor Tr62.

Note that it is preferable that the transistor Tr53 and/or the transistor Tr63 be an OS transistor. In addition, it is further preferable that a channel formation region of the transistor Tr53 and/or the transistor Tr63 be an oxide containing at least one of indium, the element M (as the element M, aluminum, gallium, yttrium, tin, or the like can be given), and zinc. It is further preferable that the transistor Tr53 and/or the transistor Tr63 have a structure of the transistor described in Embodiment 4, in particular.

The circuit WDD is electrically connected to the wiring WD and the wiring WDref. The circuit WDD has a function of transmitting first data that is to be stored in each memory cell included in the memory cell array CA.

The circuit WLD is electrically connected to the wiring WL[1] and the wiring WL[2]. The circuit WLD has a function of selecting a memory cell to which first data is written in writing of first data to the memory cell included in the memory cell array CA.

The circuit CLD is electrically connected to the wiring CL[1] and the wiring CL[2]. The circuit CLD has a function of applying a potential corresponding to the second data to back gates of the transistors Tr12 included in the memory cell array CA.

A first terminal of the analog switch SW is electrically connected to the wiring BL, and a second terminal of the analog switch SW is electrically connected to the circuit OFST. The analog switch SW includes a control terminal and the control terminal is electrically connected to the wiring ISL5. The wiring ISL5 is a wiring for switching on/off states of the analog switch SW; in this specification and the like, when a high-level potential is applied to the control terminal, the analog switch SW is turned on, and when a low-level potential is applied to the control terminal, the analog switch SW is turned off.

The analog switch SW of the arithmetic circuit MACF in FIG. 7 can be replaced with another circuit or another circuit element. As a substitute for the analog switch SW, for example, there are an electrical switch, such as a transistor (e.g., a bipolar transistor or a MOS transistor) or a diode (e.g., a PN diode, a PIN diode, a Schottky diode, an MIM (Metal Insulator Metal) diode, an MIS (Metal Insulator Semiconductor) diode, or a diode-connected transistor), a logic circuit in which such elements are combined, and the like. Furthermore, there is a mechanical switch which is a switch formed using a MEMS (micro electro mechanical systems) technology, such as a digital micromirror device (DMD). Such a switch includes an electrode that can be moved mechanically, and operates by controlling on/off states in accordance with movement of the electrode. Note that in this specification and the like, the analog switch SW, the above-mentioned electrical switches, mechanical switches, and the like are collectively called a switch.

The circuit OFST is electrically connected to a wiring OL. The circuit OFST has a function of sampling the amount of current flowing from the second terminal of the analog switch SW to the circuit OFST and/or the amount of change in the current flowing from the second terminal of the analog switch SW to the circuit OFST. In addition, the circuit OFST has a function of outputting data based on the sampling to the wiring OL. Note that the data may be current or voltage. Note that in FIG. 7, current flowing from the wiring BL to the circuit OFST through the analog switch SW is denoted as $I_\alpha$.

The activation function circuit ACTV is electrically connected to the wiring OL and a wiring NIL. A potential output from the circuit OFST is input to the activation function circuit ACTV through the wiring OL. The activation function circuit ACTV is a circuit that performs arithmetic operation according to a function defined in advance, on the potential. As the function, for example, a sigmoid function, a tanh function, a softmax function, a ReLU (Rectified Linear Unit) function, a threshold function, or the like can be used, and these functions are used as activation functions in a neural network. The output result of the activation function circuit ACTV is output to the wiring NIL.

Although a specific operation example is described later, a potential corresponding to the first data is supplied to the node NM[1] of the memory cell AM[1] and the node NM[2] of the memory cell AM[2], and a potential corresponding to the second data is applied to the wiring CL[1] and the wiring CL[2], whereby product-sum operation of the first data and the second data can be performed.

<Operation Example of Arithmetic Circuit>

Next, an operation example of product-sum operation that can be performed in the above-described arithmetic circuit MACF is described. Note that the current generation circuit IS of the arithmetic circuit MACF illustrated in FIG. 7 is the current generation circuit IS illustrated in FIG. 9.

Figure 10:
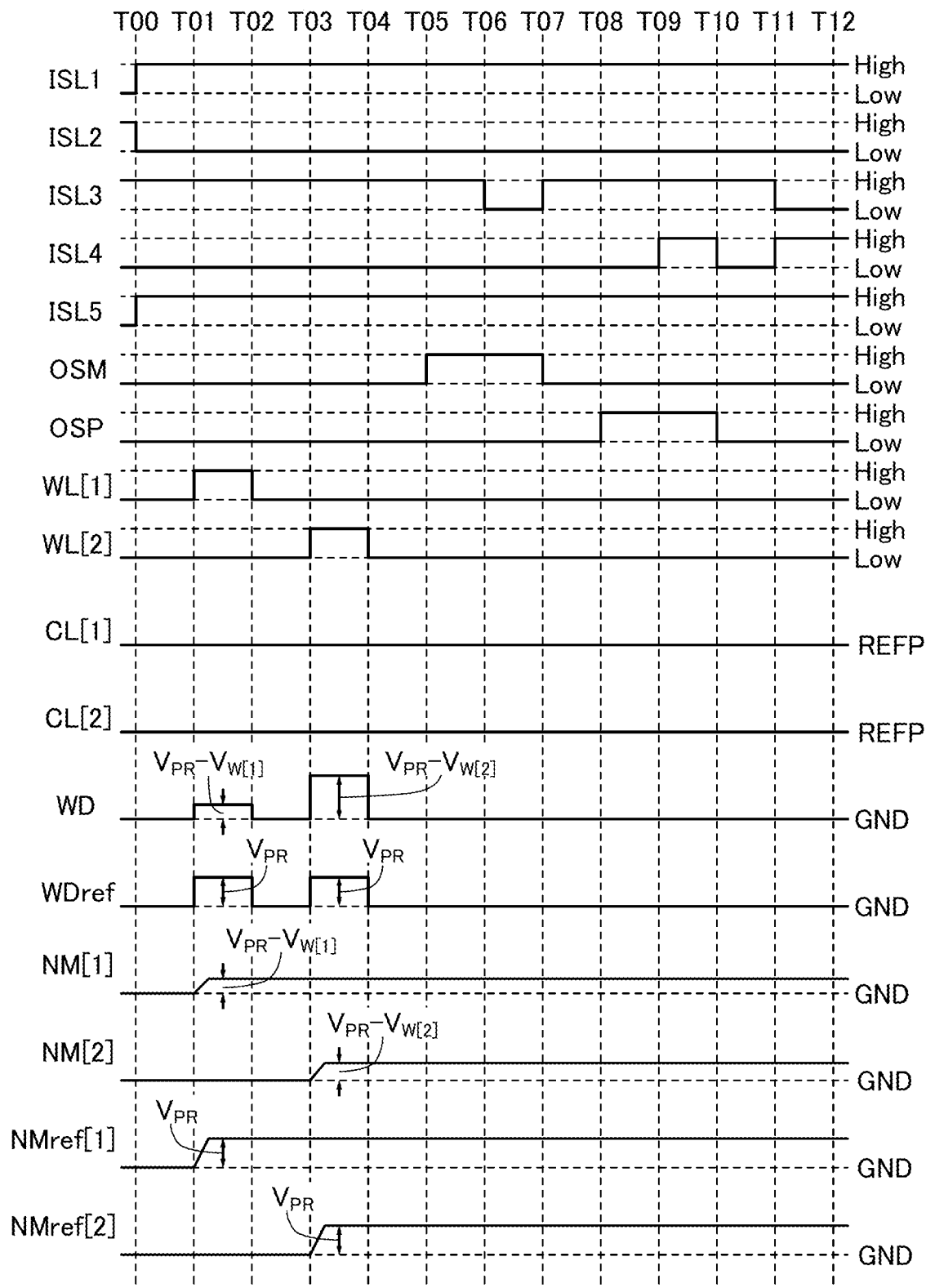
FIG. 10 A timing chart showing an operation example of an arithmetic circuit.
Figure 11:
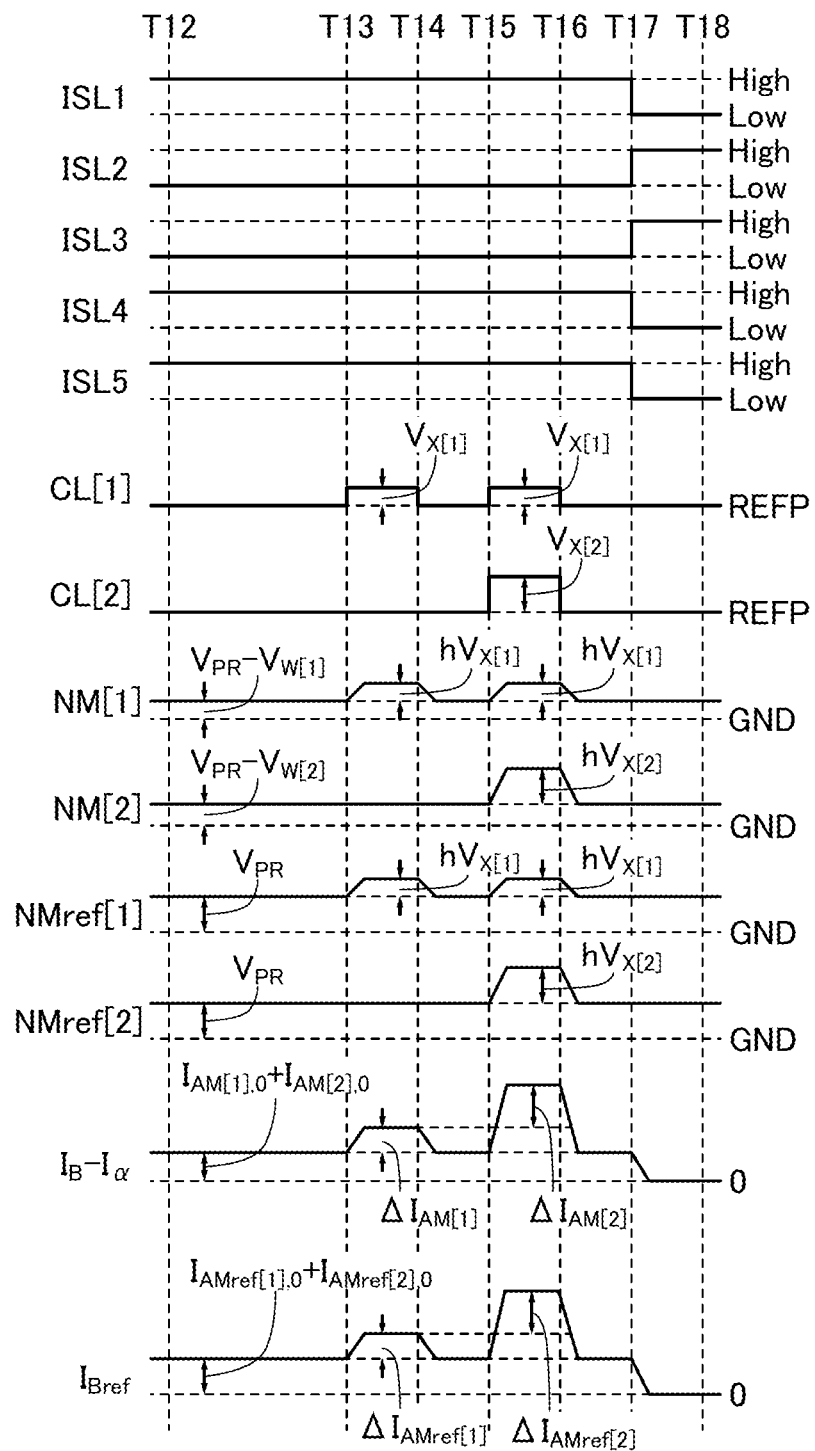
FIG. 11 A timing chart showing an operation example of an arithmetic circuit.

FIG. 10 and FIG. 11 each show a timing chart of an operation example of the arithmetic circuit MACF. The timing chart of FIG. 10 shows changes in potentials of the wiring ISL1 to the wiring ISL5, the wiring OSM, the wiring OSP, the wiring WL[1], the wiring WL[2], the wiring WD, the wiring WDref, the wiring CL[1], the wiring CL[2], the node NM[1], the node NM[2], the node NMref[1], and the node NMref[2] from Time T00 to Time T12. The timing chart of FIG. 11 shows changes in potentials of the wiring ISL1 to the wiring ISL5, the wiring CL[1], the wiring CL[2], the node NM[1], the node NM[2], the node NMref[1], and the node NMref[2], and changes in the amounts of the current $I_B-I_\alpha$ and the current $I_{Bref}$ from Time T12 to Time T18. In particular, the current $I_B-I_\alpha$ represents the total sum of current that flows from the wiring BL to the memory cell AM[1] and the memory cell AM[2] in the memory cell array CA. Note that although FIG. 11 does not show changes in the potentials of the wiring OSM, the wiring OSP, the wiring WL[1], the wiring WL[2], the wiring WD, and the wiring WDref, the potentials of the wiring OSM, the wiring OSP, the wiring WL[1], the wiring WL[2], the wiring WD, and the wiring WDref in the period from Time T11 to Time T12 are successively applied after Time T12.

<<Time before Time T00>>

In the time before Time T00, the arithmetic circuit MACF is in a stop state. The stop state is a state in which power supply voltage for driving the arithmetic circuit MACF is not supplied to the current mirror circuit CUM, the bias circuit CS, and the like. Specifically, a low-level potential (denoted as Low in FIG. 10) is applied to the wiring ISL1, a high-level potential (denoted as High in FIG. 10) is applied to the wiring ISL2, a high-level potential is applied to the wiring ISL3, a low-level potential is applied to the wiring ISL4, and a low-level potential is applied to the wiring ISL5. Moreover, a low-level potential is applied to the wiring OSM, and a low-level potential is applied to the wiring OSP.

At this time, the low-level potential is applied to the gate of the transistor Tr41 in the current mirror circuit CUM, so that the transistor Tr41 is turned on; the high-level potential is applied to a gate of the transistors Tr42, so that the transistor Tr42 is turned off. Thus, the potential VH is applied to each of the gates of the transistor Tr31 and the transistor Tr32, so that the transistor Tr31 and the transistor Tr32 are turned off. Since the transistor Tr31 and the transistor Tr32 are off, current supply from the wiring VDDML which is connected to second terminals of the transistor Tr31 and the transistor Tr32 to the current mirror circuit CUM is stopped.

In the current source circuit SOC in the bias circuit CS, the high-level potential is applied to the gate of the transistor Tr51, so that the transistor Tr51 is turned off; the low-level potential is applied to a gate of the transistor Tr53, so that the transistor Tr53 is turned off. Thus, current supply from the wiring VDDML to the terminal NC through the transistor Tr52 and the transistor Tr51 is stopped.

Furthermore, in the current sink circuit SIC in the bias circuit CS, the low-level potential is applied to the gate of the transistor Tr61, so that the transistor Tr61 is turned off; the low-level potential is applied to a gate of the transistor Tr63, so that the transistor Tr63 is turned off. Thus, letting out of current from the terminal NC to the wiring VSSML through the transistor Tr61 and the transistor Tr62 is stopped.

Since the low-level potential is applied to the wiring ISL5, the low-level potential is input to a control terminal of the analog switch SW. Thus, the analog switch SW is turned off.

That is, since driving of the current mirror circuit CUM and the bias circuit CS is stopped as described above, current supply from the current supply circuit IS to the wiring BL and the wiring BLref is not performed. In addition, since the analog switch SW is off, letting out of current to the wiring VR0 through the transistors Tr12 of the memory cells is not performed.

<<From Time T00 to Time T01>>

Next, to bring the arithmetic circuit MACF into a driving state, a potential is supplied to a predetermined wiring. Specifically, in the period from Time T00 to Time T01, the high-level potential is applied to the wiring ISL1, the low-level potential is applied to the wiring ISL2, and the high-level potential is applied to the wiring ISL5. Note that the potentials before Time T00 are successively applied to the wiring ISL3, the wiring ISL4, the wiring OSM, and the wiring OSP.

At this time, the high-level potential is applied to the gate of the transistor Tr41 in the current mirror circuit CUM, so that the transistor Tr41 is turned off; the low-level potential is applied to the gate of the transistors Tr42, so that the transistor Tr42 is turned on. Thus, the gate of the transistor Tr31 and the gate of the transistor Tr32 have a potential substantially the same as the potential of the terminal NPref; accordingly, substantially the same currents flow from the second terminal of the transistor Tr31 to the first terminal thereof and from the second terminal of the transistor Tr32 to the first terminal thereof in accordance with the potential of the terminal NPref.

Since the high-level potential is applied to the wiring ISL5, the high-level potential is input to the control terminal of the analog switch SW. Thus, the analog switch SW is turned on.

<<From Time T01 to Time T02>>

In the period from Time T01 to Time T02, the high-level potential is applied to the wiring WL[1], and the low-level potential is applied to the wiring WL[2]. Furthermore, a potential higher than a ground potential (denoted as GND in FIG. 10) by $V_{PR}-V_{w[1]}$ is applied to the wiring WD, and a potential higher than the ground potential by $V_{PR}$ is applied to the wiring WDref. Furthermore, the reference potential (denoted as REFP in FIG. 10) is applied to each of the wiring CL[1] and the wiring CL[2], and the potentials in the period from Time T00 to Time T01 are successively applied to the wiring ISL1, the wiring ISL2, the wiring ISL3, the wiring ISL4, the wiring ISL5, the wiring OSM, and the wiring OSP.

The potential $V_{w[1]}$ is a potential corresponding to one piece of the first data. The potential $V_{PR}$ is a potential corresponding to the reference data.

At this time, the high-level potential is applied to each of the gates of the transistors Tr11 in the memory cell AM[1] and the memory cell AMref[1]; accordingly, the transistors Tr11 in the memory cell AM[1] and the memory cell AMref[1] are each brought into a conduction state. Thus, in the memory cell AM[1], the wiring WD and the node NM[1] are electrically connected to each other, and the potential of the node NM[1] becomes $V_{PR}-V_{w[1]}$. Similarly, in the memory cell AMref[1], the wiring WDref and the node NMref[1] are electrically connected to each other, and the potential of the node NMref[1] becomes $V_{PR}$.

Here, the current flowing from the second terminal to the first terminal of the transistor Tr12 in each of the memory cell AM[1] and the memory cell AMref[1] is considered. When the current flowing from the wiring BL to the first terminal of the transistor Tr12 in the memory cell AM[1] through its second terminal is $I_{AM[1],0}$, $I_{AM[1],0}$ can be expressed by the following formula.

[Formula 1]

$$I_{AM[1],0}=k(V_{PR}-V_{w[1]}-V_{th})^2 \quad (E1)$$

Note that k is a constant determined by the channel length, the channel width, the mobility, the capacitance of a gate insulating film, and the like of the transistor Tr12. Furthermore, $V_{th}$ is the threshold voltage of the transistor Tr12.

When current flowing from the wiring BLref to the first terminal of the transistor Tr12 in the memory cell AMref[1] through its second terminal is $I_{AMref[1],0}$, $I_{AMref[1],0}$ can be expressed similarly by the following formula.

[Formula 2]

$$I_{AMref[1],0}=k(V_{PR}-V_{th})^2 \quad (E2)$$

Note that since the low-level potential is applied to each of the gates of the transistors Tr11 in the memory cell AM[2] and the memory cell AMref[2], the transistors Tr11 in the memory cell AM[2] and the memory cell AMref[2] are each brought into a non-conduction state. Thus, the potentials are not retained to the node NM[2] and the node NMref[2].

<<From Time T02 to Time T03>>

In the period from Time T02 to Time T03, the low-level potential is applied to the wiring WL[1]. At this time, the low-level potential is applied to each of the gates of the transistors Tr11 in the memory cell AM[1] and the memory cell AMref[1]; accordingly, the transistors Tr11 in the memory cell AM[1] and the memory cell AMref[1] are each brought into a non-conduction state.

In addition, the low-level potential remains applied to the wiring WL[2] from before Time T02. Thus, the transistors Tr11 in the memory cell AM[2] and the memory cell AMref[2] each remain in a non-conduction state since before Time T02.

Since the transistors Tr11 in the memory cell AM[1], the memory cell AM[2], the memory cell AMref[1], and the memory cell AMref[2] are each in a non-conduction state as described above, the potentials of the node NM[1], the node NM[2], the node NMref[1], and the node NMref[2] are each retained during the period from Time T02 to Time T03.

In particular, when an OS transistor is applied to each of the transistors Tr11 in the memory cell AM[1], the memory cell AM[2], the memory cell AMref[1], and the memory cell AMref[2] as mentioned in the description of the circuit configuration of the arithmetic circuit MACF, leakage current flowing between the first terminal and the second terminal of the transistor Tr11 can be made low, which makes it possible to retain the potential of each of the nodes for a long time.

During the period from Time T02 to Time T03, the ground potential is applied to the wiring WD and the wiring WDref. Since the transistors Tr11 in the memory cell AM[1], the memory cell AM[2], the memory cell AMref[1], and the memory cell AMref[2] are each in a non-conduction state, the potentials retained at the nodes of the memory cell AM[1], the memory cell AM[2], the memory cell AMref[1], and the memory cell AMref[2] are not rewritten by application of potentials from the wiring WD and the wiring WDref.

<<From Time T03 to Time T04>>

In the period from Time T03 to Time T04, the low-level potential is applied to the wiring WL[1], and the high-level potential is applied to the wiring WL[2]. Furthermore, a potential higher than the ground potential by $V_{PR}-V_{w[2]}$ is applied to the wiring WD, and a potential higher than the ground potential by $V_{PR}$ is applied to the wiring WDref. Furthermore, the reference potential is applied to each of the wiring CL[1] and the wiring CL[2], and potentials in the period from Time T02 to Time T03 are successively applied to the wiring ISL1, the wiring ISL2, the wiring ISL3, the wiring ISL4, the wiring ISL5, the wiring OSM, and the wiring OSP.

Note that the potential $V_{x[2]}$ is a potential corresponding to one piece of the first data.

At this time, the high-level potential is applied to each of the gates of the transistors Tr11 in the memory cell AM[2] and the memory cell AMref[2]; accordingly, the transistors Tr11 in the memory cell AM[2] and the memory cell AMref[2] are each brought into a conduction state. Thus, in the memory cell AM[2], the wiring WD and the node NM[2] are electrically connected to each other, and the potential of the node NM[2] becomes $V_{PR}-V_{W[2]}$. Similarly, in the memory cell AMref[2], the wiring WDref and the node NMref[2] are electrically connected to each other, and the potential of the node NMref[2] becomes $V_{PR}$.

Here, the current flowing from the second terminal to the first terminal of the transistor Tr12 in each of the memory cell AM[2] and the memory cell AMref[2] is considered. When the current flowing from the wiring BL to the first terminal of the transistor Tr12 in the memory cell AM[2] through its second terminal is $I_{AM[2],0}$, $I_{AM[2],0}$ can be expressed by the following formula.

[Formula 3]

$$I_{AM[2],0} = k(V_{PR}-V_{W[2]}-V_{th})^2 \quad (E3)$$

When current flowing from the wiring BLref to the first terminal of the transistor Tr12 in the memory cell AMref[2] through its second terminal is $I_{AMref[2],0}$, $I_{AMref[2],0}$ can be expressed similarly by the following formula.

[Formula 4]

$$I_{AMref[2],0} = k(V_{PR}-V_{th})^2 \quad (E4)$$

<<From Time T04 to Time T05>>

In the period from Time T04 to Time T05, the low-level potential is applied to the wiring WL[2]. At this time, the low-level potential is applied to each of the gates of the transistors Tr11 in the memory cell AM[2] and the memory cell AMref[2]; accordingly, the transistors Tr11 in the memory cell AM[2] and the memory cell AMref[2] are each brought into a non-conduction state.

In addition, the low-level potential remains applied to the wiring WL[1] from before Time T04. Thus, the transistors Tr11 in the memory cell AM[1] and the memory cell AMref[1] each remain in a non-conduction state after Time T02 to Time T04.

In the period from Time T04 to Time T05, the ground potential is applied to the wiring WD and the wiring WDref in a manner similar to that in the period from Time T02 to Time T03. Since the transistors Tr11 in the memory cell AM[1], the memory cell AM[2], the memory cell AMref[1], and the memory cell AMref[2] are each in a non-conduction state, the potentials retained at the nodes of the memory cell AM[1], the memory cell AM[2], the memory cell AMref[1], and the memory cell AMref[2] are not rewritten by application of potentials from the wiring WD and the wiring WDref.

<<From Time T05 to Time T06>>

In the period from Time T05 to Time T06, the high-level potential is applied to the wiring OSM. Furthermore, potentials before Time T05 are successively applied to the wiring ISL1, the wiring ISL2, the wiring ISL3, the wiring ISL4, the wiring ISL5, and the wiring OSP.

At this time, in the bias circuit CS, the high-level potential is applied to the gate of the transistor Tr53, so that the transistor Tr53 is turned on. Thus, the gate of the transistor Tr52 and the first terminal of the transistor Tr52 are electrically connected to each other, so that the transistor Tr52 has a diode-connected structure. Since the transistor Tr51 is off, the potential of the gate of the transistor Tr52 is the potential obtained by adding the threshold voltage of the transistor Tr52 to the VDDM over time. In other words, the voltage between the first terminal and the second terminal of the capacitor C5 is substantially the value of the threshold voltage of the transistor Tr52.

<<From Time T06 to Time T07>>

In the period from Time T06 to Time T07, the low-level potential is applied to the wiring ISL3. Thus, the transistor Tr51 is turned on.

At this time, current might flow from the wiring VDDML to the terminal NC through the transistor Tr51 and the transistor Tr52. The amount of the current is determined by the current $I_{CM}$ flowing through the current mirror circuit CUM, the current $I_{AM[1]}$ flowing through the memory cell AM[1], the current $I_{AM[2]}$ flowing through the memory cell AM[2], and the like; at the same time, the potential of the gate of the transistor Tr52 is also determined.

<<From Time T07 to Time T08>>

In the period from Time T07 to Time T08, the high-level potential is applied to the wiring ISL3, and the low-level potential is applied to the wiring OSM. Thus, the transistor Tr51 is turned off and the transistor Tr53 is turned off, the potential of the gate of the transistor Tr52 can be retained, and current corresponding to the potential can be supplied between the first terminal and the second terminal of the transistor Tr52.

<<From Time T08 to Time T09>>

In the period from Time T08 to Time T09, the high-level potential is applied to the wiring OSP. Furthermore, potentials before Time T08 are successively applied to the wiring ISL1, the wiring ISL2, the wiring ISL3, the wiring ISL4, and the wiring OSM.

At this time, in the bias circuit CS, the high-level potential is applied to the gate of the transistor Tr63, so that the transistor Tr63 is turned on. Thus, the gate of the transistor Tr62 and the first terminal of the transistor Tr62 are electrically connected to each other, so that the transistor Tr62 has a diode-connected structure. Since the transistor Tr61 is off, the potential of the gate of the transistor Tr62 is the potential obtained by adding the threshold voltage of the transistor Tr62 to the VSSM over time. In other words, the voltage between the first terminal and the second terminal of the capacitor C6 is substantially the value of the threshold voltage of the transistor Tr62.

<<From Time T09 to Time T10>>

In the period from Time T09 to Time T10, the low-level potential is applied to the wiring ISL4. Thus, the transistor Tr61 is turned on.

At this time, current might flow from the terminal NC to the wiring VSSML through the transistor Tr61 and the transistor Tr62. The amount of the current is determined by the current $I_{CM}$ flowing through the current mirror circuit CUM, the current $I_{AM[1]}$ flowing through the memory cell AM[1], the current $I_{AM[2]}$ flowing through the memory cell AM[2], and the like; at the same time, the potential of the gate of the transistor Tr62 is also determined.

<<From Time T10 to Time T11>>

In the period from Time T10 to Time T11, the low-level potential is applied to the wiring ISL4, and the low-level potential is applied to the wiring OSP. Thus, the transistor Tr61 is turned off and the transistor Tr63 is turned off, the potential of the gate of the transistor Tr62 can be retained, and current corresponding to the potential can be supplied between the first terminal and the second terminal of the transistor Tr62.

<<From Time T11 to Time T12>>

In the period from Time T10 to Time T11, the low-level potential is applied to the wiring ISL3, and the high-level potential is applied to the wiring ISL4. Accordingly, current corresponding to the potential of the gate of the transistor Tr52 flows from the wiring VDDML to the terminal NC and/or the current corresponding to the potential of the gate of the transistor Tr62 flows from the terminal NC to the wiring VSSML.

<<From Time T12 to Time T13>>

Here, currents that flow in the wiring BL and the wiring BLref are described.

Current from the current mirror circuit CUM is supplied to the wiring BLref, and the current is let out to the memory cell AMref[1] and the memory cell AMref[2]. When the current let out by the current mirror circuit CUM is $I_{CM,0}$ in the wiring BLref, the following formula is satisfied according to Kirchhoff's law.

[Formula 5]

$$I_{CM,0} = I_{Bref} = I_{AMref[1],0} + I_{AMref[2],0} \quad (E5)$$

Current is supplied to and/or let out from the wiring BL by the bias circuit CS. In addition, current from the current mirror circuit CUM is supplied to the wiring BL, and let out to the memory cell AM[1] and the memory cell AM[2]. Furthermore, current flows also in the circuit OFST from the wiring BL through the analog switch SW. When the current supplied from the bias circuit CS is $I_{CS}$ and the current that flows from the wiring BL to the circuit OFST is $I_{\alpha,0}$ in the wiring BL, the following formula is satisfied according to Kirchhoff's law.

[Formula 6]

$$I_{CM,0} + I_{CS} = I_{AM[1],0} + I_{AM[2],0} I_{\alpha,0} \quad (E6)$$

<<From Time T13 to Time T14>>

In the period from Time T13 to Time T14, a potential higher than the reference potential by $V_{X[1]}$ is applied to the wiring CL[1]. At this time, the potential $V_{X[1]}$ is applied to each of the second terminals of the capacitors CP in the memory cell AM[1] and the memory cell AMref[1]; thus, the potentials of the node NM[1] and the node NMref[1] are changed by capacitive coupling. Thus, the amount of current flowing between the first terminal and the second terminal of the transistor Tr12 is increased or decreased.

Note that the potential $V_{X[1]}$ is a potential corresponding to one piece of the second data.

Note that the amount of change in the potential of the gate of the transistor Tr12 corresponds to a potential obtained by multiplying a change in the potential of the wiring CL[1] by a capacitive coupling coefficient determined by the memory cell configuration. The capacitive coupling coefficient is calculated using the capacitance of the capacitor CP, the gate capacitance of the transistor Tr12, the parasitic resistance, and the like. In this operation example, the capacitive coupling coefficient is denoted by h. That is, when the amount of change in the gate potential of the transistor Tr12 is assumed to be $\Delta V$, $\Delta V$ can be obtained by the following formula.

[Formula 7]

$$\Delta V = h V_{X[1]} \quad (E7)$$

The potential $V_{X[1]}$ is applied to the second terminal of the capacitor CP in each of the memory cell AM[1] and the memory cell AMref[1], so that the potentials of the gates of the transistors Tr12 each increase by $hV_{X[1]}$. In other words, when the potential $V_{X[1]}$ is applied to the second terminal of the capacitor CP in each of the memory cell AM[1] and the memory cell AMref[1], the potentials of the node NM[1] and the node NMref[1] each increase by $hV_{X[1]}$.

Here, the current flowing from the second terminal to the first terminal of the transistor Tr12 in each of the memory cell AM[1] and the memory cell AMref[1] is considered. When the current flowing from the wiring BL to the first terminal of the transistor Tr12 in the memory cell AM[1] through its second terminal is $I_{AM[1],1}$, $I_{AM[1],1}$ can be expressed by the following formula.

[Formula 8]

$$I_{AM[1],1} = k(V_{PR} - V_{W[1]} + hV_{X[1]} - V_{th})^2 \quad (E8)$$

In other words, by application of the potential $V_{X[1]}$ to the wiring CL[1], the current flowing from the wiring BL to the first terminal of the transistor Tr12 in the memory cell AM[1] through its second terminal increases by $I_{AM[1],1} - I_{AM[1],0}$ (denoted by $\Delta I_{AM[1]}$ in FIG. 11).

Similarly, when current flowing from the wiring BLref to the first terminal of the transistor Tr12 in the memory cell AMref[1] through its second terminal is $I_{AMref[1],1}$, $I_{AMref[1],1}$ can be expressed by the following formula.

[Formula 9]

$$I_{AMref[1],1} = k(V_{PR} + hV_{X[1]} - V_{th})^2 \quad (E9)$$

In other words, by application of the potential $V_{X[1]}$ to the wiring CL[1], the current flowing from the wiring BLref to the first terminal of the transistor Tr12 in the memory cell AMref[1] through its second terminal increases by $I_{AMref[1],1} - I_{AMref[1],0}$ (denoted by $\Delta I_{AMref[1]}$ in FIG. 11).

Here, currents that flow in the wiring BL and the wiring BLref are described.

In a manner similar to that in the period from Time T12 to Time T13, current from the current mirror circuit CUM is supplied to the wiring BLref, and the current is let out to the memory cell AMref[1] and the memory cell AMref[2]. When the current let out by the current mirror circuit CUM is $I_{CM,1}$ in the wiring BLref, the following formula is satisfied according to Kirchhoff's law.

[Formula 10]

$$I_{CM,1} = I_{AMref[1],1} + I_{AMref[2],1} \quad (E10)$$

In a manner similar to that in the period from Time T12 to Time T13, current is supplied to and/or let out from the wiring BL by the bias circuit CS. In addition, current from the current mirror circuit CUM is supplied to the wiring BL, and let out to the memory cell AM[1] and the memory cell AM[2]. Furthermore, current flows also in the circuit OFST from the wiring BL through the analog switch SW. The current supplied from the bias circuit CS becomes $I_{CS}$ because the potentials of the gates of the transistor Tr52 and the transistor Tr62 are not changed from those in the period from Time T12 to Time T13. When the current that flows from the wiring BL to the circuit OFST is $I_{\alpha,1}$ in the wiring BL, the following formula is satisfied according to Kirchhoff's law.

[Formula 11]

$$I_{CM,1} + I_{CS} = I_{AM[1],1} + I_{AM[2],1} + I_{\alpha,1} \quad (E11)$$

Note that $\Delta I_\alpha$ represents the difference between the current $I_{\alpha,0}$ flowing from the wiring BL to the circuit OFST in the period from Time T12 to Time T13 and the current $I_{\alpha,1}$ flowing from the wiring BL to the circuit OFST in the period from Time T13 to Time T14. Hereinafter, $\Delta I_\alpha$ is referred to as a difference current in the arithmetic circuit MACF. The difference current $\Delta I_\alpha$ can be expressed by the following formula, using Formula (E1) to Formula (E6) and Formula (E8) to Formula (E11).

[Formula 12]

$$\Delta I_\alpha = I_{\alpha,1} - I_{\alpha,0} = 2hkV_{W[1]}V_{X[1]} \quad (E12)$$

<<From Time T14 to Time T15>>

In the period from Time T14 to Time T15, the reference potential is applied to the wiring CL[1]. At this time, the reference potential is applied to the second terminal of the capacitor CP in each of the memory cell AM[1] and the memory cell AMref[1]; thus, the gate potential of the transistor Tr12 (each of the potentials of the node NM[1] and the node NMref[1]) return to the potentials in the period from Time T12 to Time T13.

<<From Time T15 to Time T16>>

In the period from Time T15 to Time T16, a potential higher than the reference potential by $V_{X[2]}$ is applied to the wiring CL[1], and a potential higher than the reference potential by $V_{X[2]}$ is applied to the wiring CL[2]. At this time, the potential $V_{X[1]}$ is applied to the second terminal of the capacitor CP in each of the memory cell AM[1] and the memory cell AMref[1], and the potential $V_{X[2]}$ is applied to the second terminal of the capacitor CP in each of the memory cell AM[2] and the memory cell AMref[2]. Consequently, the potential of the gate of the transistor Tr12 in each of the memory cell AM[1], the memory cell AM[2], the memory cell AMref[1], and the memory cell AMref[2] changes. In other words, the potentials of the node NM[1], the node NM[2], the node NMref[1], and the node NMref[2] change.

For the changes in the potentials of the node NM[1] and the node NMref[1], the description of the operation in the period from Time T13 to Time T14 is referred to. Similarly, the memory cell AM[2] and the memory cell AMref[2] are described on the assumption that the capacitive coupling coefficient of each memory cell is h.

Since the capacitive coupling coefficient is set to h, the potential $V_{X[2]}$ is applied to the second terminal of the capacitor CP in each of the memory cell AM[2] and the memory cell AMref[2], so that the potentials of the gates of the transistors Tr12 each increase by $hV_{X[2]}$. In other words, when the potential $V_{X[2]}$ is applied to the second terminal of the capacitor CP in each of the memory cell AM[2] and the memory cell AMref[2], the potentials of the node NM[2] and the node NMref[2] each increase by $hV_{X[2]}$.

Here, the current flowing from the second terminal to the first terminal of the transistor Tr12 in each of the memory cell AM[2] and the memory cell AMref[2] is considered. When the current flowing from the wiring BL to the first terminal of the transistor Tr12 in the memory cell AM[1] through its second terminal is $I_{AM[2],1}$, $I_{AM[2],1}$ can be expressed by the following formula.

[Formula 13]

$$I_{AM[2],1} = k(V_{PR} - V_{W[2]} + hV_{X[2]} - V_{th})^2 \quad (E13)$$

In other words, by application of the potential $V_{X[2]}$ to the wiring CL[2], the current flowing from the wiring BL to the first terminal of the transistor Tr12 in the memory cell AM[2] through its second terminal increases by $I_{AM[2],1} - I_{AM[2],0}$ (denoted by $\Delta I_{AM[2]}$ in FIG. 11).

Similarly, when current flowing from the wiring BLref to the first terminal of the transistor Tr12 in the memory cell AMref[2] through its second terminal is $I_{AMref[2],1}$, $I_{AMref[2],1}$ can be expressed by the following formula.

[Formula 14]

$$I_{AMref[2],1} = k(V_{PR} + hV_{X[2]} - V_{th})^2 \quad (E14)$$

In other words, by application of the potential $V_{X[2]}$ to the wiring CL[2], the current flowing from the wiring BLref to the first terminal of the transistor Tr12 in the memory cell AMref[2] through its second terminal increases by $I_{AMref[2],1} - I_{AMref[2],0}$ (denoted by $\Delta_{AMref[2]}$ in FIG. 11).

Here, currents that flow in the wiring BL and the wiring BLref are described.

In a manner similar to that in the period from Time T12 to Time T13, current from the current mirror circuit CUM is supplied to the wiring BLref, and the current is let out to the memory cell AMref[1] and the memory cell AMref[2]. When the current let out by the current mirror circuit CUM is $I_{CM,2}$ in the wiring BLref, the following formula is satisfied according to Kirchhoff's law.

[Formula 15]

$$I_{CM,2} = I_{AMref[1],1} + I_{AMref[2],1} \quad (E15)$$

In a manner similar to that in the period from Time T12 to Time T13, current is supplied to and/or let out from the wiring BL by the bias circuit CS. In addition, current from the current mirror circuit CUM is supplied to the wiring BL, and let out to the memory cell AM[1] and the memory cell AM[2]. Furthermore, current flows also in the circuit OFST from the wiring BL through the analog switch SW. The current supplied from the bias circuit CS becomes $I_{CS}$ because the potentials of the gates of the transistor Tr52 and the transistor Tr62 are not changed from those in the period from Time T12 to Time T13. When the current that flows from the wiring BL to the circuit OFST is $I_{\alpha,3}$ in the wiring BL, the following formula is satisfied according to Kirchhoff's law.

[Formula 16]

$$I_{CM,2} + I_{CS} = I_{AM[1],1} + I_{AM[2],1} + I_{\alpha,3} \quad (E16)$$

The difference current $\Delta I_\alpha$, the difference between the current $I_{\alpha,0}$ flowing from the wiring BL to the circuit OFST in the period from Time T12 to Time T13 and the current $I_{\alpha,3}$ flowing from the wiring BL to the circuit OFST in the period from Time T07 to Time T08, can be expressed by the following formula, using Formula (E1) to Formula (E6), Formula (E8), Formula (E9), and Formula (E13) to Formula (E16).

[Formula 17]

$$\Delta I_\alpha = I_{\alpha,3} - I_{\alpha,0} = 2hk(V_{W[1]}V_{X[1]} + V_{W[2]}V_{X[2]}) \quad (E17)$$

As shown in Formula (E12) and Formula (E17), the differential current $\Delta I_\alpha$ input to the circuit OFST can be calculated from the formula including a product term of the potential $V_X$ corresponding to a plurality of the first data and the potential $V_W$ corresponding to a plurality of the second data. In other words, when the differential current $\Delta I_\alpha$ is measured by the circuit OFST, the value of the sum of products of the first data and the second data can be obtained.

<<From Time T16 to Time T17>>

In the period from Time T16 to Time T17, the ground potential is applied to the wiring CL[1] and the wiring CL[2]. At this time, the ground potential is applied to the second terminal of the capacitor CP in each of the memory cell AM[1], the memory cell AM[2], the memory cell AMref[1], and the memory cell AMref[2]; thus, the potential of the gate of the transistor Tr12 (the potentials of the node NM[1], the node NM[2], the node NMref[1], and the node NMref[2]) returns to the gate potentials in the period from Time T14 to Time T15.

Although $V_{W[1]}$ was applied to the wiring CL[1] in the period from Time T13 to Time T14 and $V_{W[1]}$ and $V_{W[2]}$ were applied to the wiring CL[1] and the wiring CL[2], respectively, during the period from Time T15 to Time T16, potentials that are applied to the wiring CL[1] and the wiring CL[2] may be lower than the reference potential REFP. In the case where a potential lower than the reference potential REFP is applied to the wiring CL[1] and/or the wiring CL[2], the potential of the gate of the transistor Tr12 connected to the wiring CL[1] and/or the wiring CL[2] can be decreased. Thus, multiplication of the first data and one piece of the second data, which is a negative value, can be performed in the product-sum operation. For example, in the case where $-V_{W[2]}$, instead of $V_{W[2]}$, is applied to the wiring CL[2] in the period from Time T15 to Time T16, the difference current $\Delta I_\alpha$ can be expressed by the following formula.

[Formula 18]

$$\Delta I_\alpha = I_{\alpha,3} - I_{\alpha,0} = 2hk(V_{W[1]}V_{X[1]} - V_{W[2]}V_{X[2]}) \quad (E18)$$

Although the memory cell array MA including memory cells arranged in a matrix of two rows and two columns is used in this operation example, product-sum operation can be similarly performed in a memory cell array of one row and two or more columns and a memory cell array of three or more rows and three or more columns. In the memory cell array in such a case, memory cells in one of the plurality of columns are used for retaining reference data (potential $V_{PR}$), whereby product-sum operations, the number of which corresponds to the number of the rest of the columns among the plurality of columns, can be executed concurrently. That is, when the number of columns in a memory cell array is increased, a semiconductor device that achieve high-speed product-sum operation can be provided. Furthermore, increasing the number of rows allows an increase in the number of terms to be added to each other in the product-sum operation. The difference current $\Delta I_\alpha$ when the number of rows is increased can be expressed by the following formula.

[Formula 19]

$$\Delta I_\alpha = 2hk \sum_i V_{W[i]} V_{X[i]} \quad (E19)$$

<<From Time T17 to Time T18>>

In the period from Time T14 to Time T15, the low-level potential is applied to the wiring ISL1, the high-level potential is applied to the wiring ISL2, the high-level potential is applied to the wiring ISL3, and the low-level potential is applied to the wiring ISL4.

At this time, the low-level potential is applied to the gate of the transistor Tr41 in the current mirror circuit CUM, so that the transistor Tr41 is turned on; the high-level potential is applied to a gate of the transistors Tr42, so that the transistor Tr42 is turned off. Thus, the potential VH is applied to each of the gates of the transistor Tr31 and the transistor Tr32, so that the transistor Tr31 and the transistor Tr32 are turned off. Since the transistor Tr31 and the transistor Tr32 are off, current supply from the wiring VDDML which is connected to second terminals of the transistor Tr31 and the transistor Tr32 to the current mirror circuit CUM can be stopped.

In the current source circuit SOC in the bias circuit CS, the high-level potential is applied to the gate of the transistor Tr51, so that the transistor Tr51 is turned off; the low-level potential is applied to a gate of the transistor Tr53, so that the transistor Tr53 is turned off. Thus, current supply from the wiring VDDML to the terminal NC through the transistor Tr52 and the transistor Tr51 and letting out of current from the terminal NC to the wiring VSSML through the transistor Tr61 and the transistor Tr62 can be stopped.

Since the low-level potential is applied to the wiring ISL5, the low-level potential is input to the control terminal of the analog switch SW. Thus, the analog switch SW is turned off.

That is, since driving of the current mirror circuit CUM and the bias circuit CS is stopped as described above, current supply from the current supply circuit IS to the wiring BL and the wiring BLref is not performed. In addition, since the analog switch SW is off, letting out of current to the wiring VR0 through the transistors Tr12 of the memory cells is not performed.

As described above, after the arithmetic operation is performed, predetermined potentials are applied to the wiring ISL1 to the wiring ISL5, the wiring OSM, and the wiring OSP of the arithmetic circuit MACF, whereby the arithmetic circuit MACF can be brought into a stop state. In the case where calculation is performed again, the arithmetic circuit MACF is brought into a driving state by application of predetermined potentials to the wiring ISL1 to the wiring ISL5, the wiring OSM, and the wiring OSP of the arithmetic circuit MACF. That is, the arithmetic circuit MACF can perform arithmetic operation when needed as intermittent driving.

The arithmetic circuit described in this embodiment can be used for a hierarchical neural network, for example. Specifically, in the hierarchical neural network, when a signal is supplied from all the neurons included in the (K−1)-th layer (K is an integer of 2 or larger) to one of neurons included in the K-th layer, the above-described first data is used as a weight coefficient and the above-described second data is used as an intensity of a signal output from the (K−1) layer; thus, the sum of products of the intensity of the signal output from the (K−1) layer and the weight coefficient can be calculated. Furthermore, the value of the activation function can be obtained by input of the result of the sum of products to the activation function circuit ACTV. The value of the activation function can be the signal input to one of the neurons included in the K-th layer.

In the memory cell array MA in the arithmetic circuit described in this embodiment, the number of the rows in the memory cell array MA corresponds to the number of neurons in the previous layer. In other words, the number of the rows of the memory cells AM corresponds to the number of output signals of the neurons in the previous layer which are input to the next layer. The number of the columns in the memory cell array MA corresponds to the number of neurons in the next layer. In other words, the number of the columns in the memory cell array MA corresponds to the number of output signals of the neurons that are output from the next layer. That is to say, the number of the rows and the number of the columns in the memory cell array MA of the arithmetic circuit are determined depending on the number of neurons in each of the previous layer and the next layer; thus, a neural network is designed by determining the number of the rows and the number of the columns in the memory cell array depending on the desired configuration.

Here, the case where the input layer includes 1024 neuron units, the hidden layer includes 128 neuron units, and the output layer includes 32 neuron units is considered. In that case, a structure in which two arithmetic circuits MACF are electrically connected to each other may be employed. In the memory cell array CA in the arithmetic circuit MACF in the first stage, the memory cells AM may be arranged in a matrix of 1024 rows and 128 columns and the memory cells AMref may be arranged in a matrix of 1024 rows and 16 columns. In the memory cell array CA in the arithmetic circuit MACF in the second stage, the memory cells AM may be arranged in a matrix of 128 rows and 32 columns and the memory cells AMref may be arranged in a matrix of 128 rows and 4 columns. With such a configuration, 128 output signals output from the arithmetic circuit MACF in the first stage can be input to the memory cells AM and the memory cells AMref in the 128 rows in the arithmetic circuit MACF in the second stage.

The memory cell AM and the memory cell AMref each have a circuit configuration the same as a gain cell including two transistors, and can perform multiplication of analog data or multilevel data with use of a small number of transistors.

In the case where the arithmetic circuit MACF is used for the OSAI chip described in Embodiment 2 as the MAC arrays 405 and 406, the OSAI chip 400 that has low power consumption and capable of performing massively parallel arithmetic processing can be provided. For example, in the case where the total number of the memory cells AM and the memory cells AMref included in the memory cell array CA is approximately $10^6$ to $10^8$ and the operating frequency is 3 MHz to 30 MHz, the arithmetic performance of the OSAI chip 400 is approximately 3TOPS (Tera Operations Per Second) to 3POPS (Peta OPS).

Since the arithmetic performance of the OSAI chip 400 is determined depending on the circuit size and the operating frequency of the arithmetic circuit MACF as described above, in the case where the demanded arithmetic performance is relatively low, the circuit size of the arithmetic circuit MACF can be small, and/or the operating frequency thereof can be low. In that case, the power consumption of the arithmetic circuit MACF can be further reduced.

As a method for reducing the power consumption of the arithmetic circuit MACF, the potential VDDM for driving the current supply circuit IS may be set low. Furthermore, a potential difference between the potential VDDM and the potential VSSM may be made small. In the case where the number of terms of the sum of products of the first data and the second data is small in the parallel arithmetic processing in the arithmetic circuit MACF, the amount of current flowing in the wiring BL is small, and in accordance with that, the potential VDDM and/or the potential VSSM may be changed to reduce the power consumption.

Note that this embodiment can be combined with other embodiments in this specification as appropriate.

Embodiment 4

In this embodiment, an example of a structure of an OS transistor that can be used in the semiconductor device including the arithmetic circuit MACF described in the above embodiment will be described.
<Structure Example of Semiconductor Device>

Figure 12:
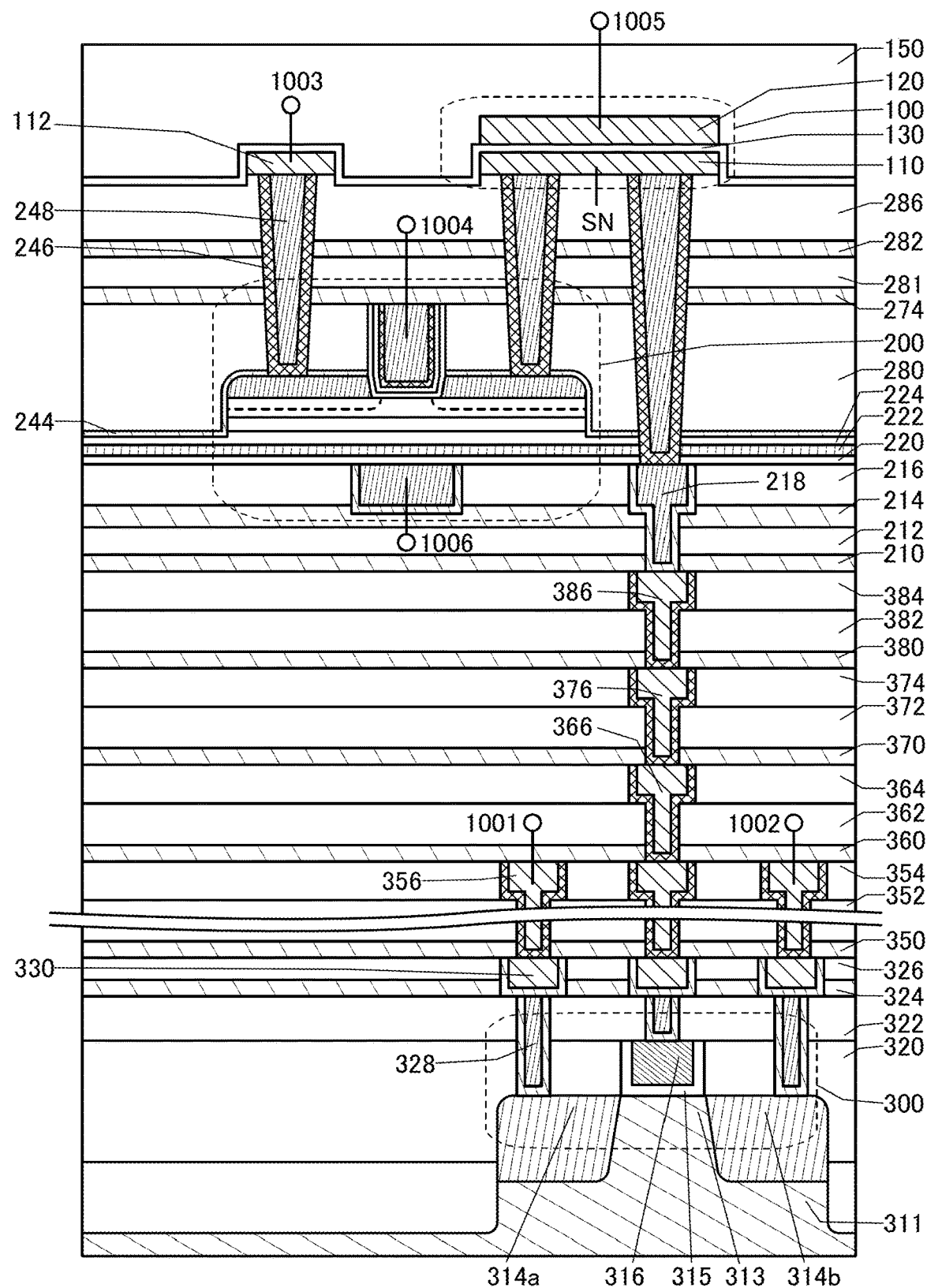
FIG. 12 A diagram illustrating a structure example of a semiconductor device.
Figure 13A:
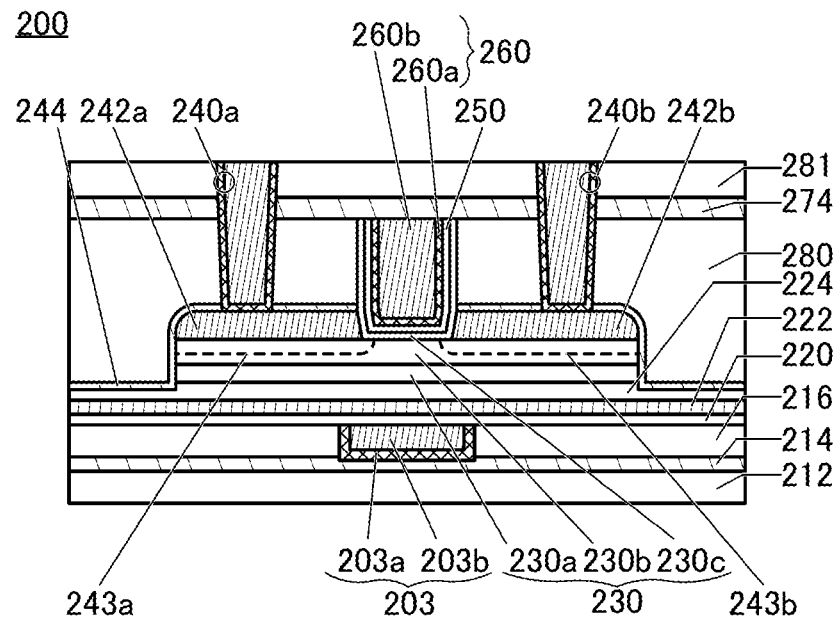
FIGS. 13A to 13C Diagrams illustrating a structure example of a transistor.
Figure 13B:
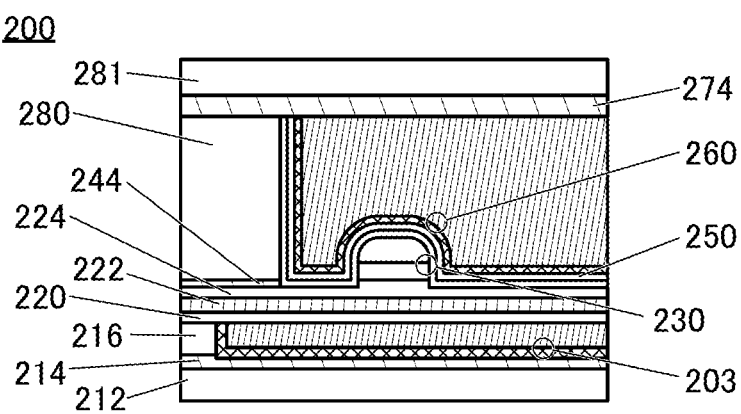
Figure 13C:
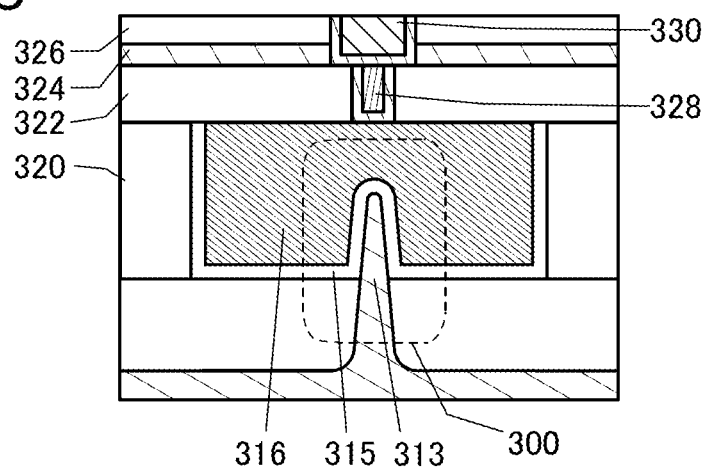

A semiconductor device illustrated in FIG. 12 includes a transistor 300, a transistor 200, and a capacitor 100. FIG. 13(A) is a cross-sectional view of the transistor 200 in the channel length direction. FIG. 13(B) is a cross-sectional view of the transistor 200 in the channel width direction. FIG. 13(C) is a cross-sectional view of the transistor 300 in the channel width direction.

The transistor 200 is a transistor whose channel is formed in a semiconductor layer including an oxide semiconductor. Since the off-state current of the transistor 200 is low, a semiconductor device using such a transistor can retain the stored content for a long time. In other words, refresh operation is not required or the frequency of refresh operation is extremely low; thus, the power consumption of the semiconductor device can be sufficiently reduced.

In the semiconductor device illustrated in FIG. 12, a wiring 1001 is electrically connected to one of a source and a drain of the transistor 300, and a wiring 1002 is electrically connected to the other of the source and the drain of the transistor 300. A wiring 1003 is electrically connected to one of the source and the drain of the transistor 200, a wiring 1004 is electrically connected to a top gate of the transistor 200, and a wiring 1006 is electrically connected to a bottom gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

Here, in the case where the semiconductor device described in this embodiment is used for the memory cell AM[1] included in the memory cell array CA of the arithmetic circuit MACF described in Embodiment 3, the transistor Tr12 corresponds to the transistor 300, the transistor Tr11: the transistor 200, and the capacitor CP: the capacitor 100. In addition, the wiring VR0 corresponds to the wiring 1001, the wiring BL: the wiring 1002, the wiring WD: the wiring 1003, the wiring WL[1]: the wiring 1004, and the wiring CL[1]: the wiring 1005. Note that in the case where the transistor Tr11 includes a back gate, the wiring 1006 corresponds to a wiring electrically connected to the back gate. Note that for the memory cell AM[2], the memory cell AMref[1], and the memory cell AMref[2] included in the memory cell array CA, the above description is referred to.

The semiconductor device of one embodiment of the present invention includes the transistor 300, the transistor 200, and the capacitor 100 as illustrated in FIG. 12. The transistor 200 is provided above the transistor 300, and the capacitor 100 is provided above the transistor 300 and the transistor 200.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

In the transistor 300, the top surface and the side surface in the channel width direction of the semiconductor region 313 are covered with the conductor 316 with the insulator 315 therebetween, as illustrated in FIG. 13(C). Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance regions 314a and 314b functioning as the source and drain regions, and the like preferably contain a semiconductor such as a silicon-based semiconductor, further preferably contain single crystal silicon. Alternatively, a material including germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a HEMT (High-Electron-Mobility Transistor) with GaAs and GaAlAs, or the like.

The low-resistance regions 314a and 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material used for a conductor; therefore, changing the material for the conductor can adjust the Vth of the transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

Note that the transistor 300 illustrated in FIG. 12 is an example and the structure is not limited thereto; an appropriate transistor is used in accordance with a circuit configuration or a driving method. For example, as in the transistor 200, an oxide semiconductor may be used in the transistor 300.

An insulator 320, an insulator 322, an insulator 324, and an insulator 326 are stacked in this order to cover the transistor 300.

For the insulators 320, 322, 324, and 326, silicon oxide, silicon oxynitride, silicon nitride oxide, silicon nitride, aluminum oxide, aluminum oxynitride, aluminum nitride oxide, or aluminum nitride can be used, for example.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 200 is provided.

For the film having a barrier property against hydrogen, silicon nitride formed by a CVD method can be used, for example. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low dielectric constant for an interlayer film can reduce the parasitic capacitance between wirings.

A conductor 328, a conductor 330, and the like that are connected to the capacitor 100 or the transistor 200 are provided in the insulators 320, 322, 324, and 326. Note that each of the conductors 328 and 330 functions as a plug or a wiring. A plurality of conductors functioning as plugs or wirings are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. For example, as the material, it is preferable to use a high-melting-point material that has both heat resistance and conductivity, such as tungsten or molybdenum, and it is particularly preferable to use tungsten. Alternatively, as the material, a low-resistance conductive material such as aluminum or copper is preferably used. The use of a low-resistance conductive material can reduce wiring resistance.

A wiring layer may be provided over the insulator 326 and the conductor 330. For example, in FIG. 12, an insulator 350, an insulator 352, and an insulator 354 are stacked in this order. Furthermore, a conductor 356 is formed in the insulator 350, the insulator 352, and the insulator 354. The conductor 356 functions as a plug or a wiring that is connected to the transistor 300. Note that the conductor 356 can be formed using a material similar to that for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 200 can be separated by a barrier layer, so that the diffusion of hydrogen from the transistor 300 to the transistor 200 can be prevented.

Note that as the conductor having a barrier property against hydrogen, tantalum nitride can be used, for example. The use of a stack including tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 12, an insulator 360, an insulator 362, and an insulator 364 are stacked in this order. Moreover, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 200 can be separated by a barrier layer, so that the diffusion of hydrogen from the transistor 300 to the transistor 200 can be prevented.

A wiring layer may be provided over the insulator 364 and the conductor 366. For example, in FIG. 12, an insulator 370, an insulator 372, and an insulator 374 are stacked in this order. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 200 can be separated by a barrier layer, so that the diffusion of hydrogen from the transistor 300 to the transistor 200 can be prevented.

A wiring layer may be provided over the insulator 374 and the conductor 376. For example, in FIG. 12, an insulator 380, an insulator 382, and an insulator 384 are stacked in this order. Moreover, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 200 can be separated by a barrier layer, so that the diffusion of hydrogen from the transistor 300 to the transistor 200 can be prevented.

Although the wiring layer including the conductor 356, the wiring layer including the conductor 366, the wiring layer including the conductor 376, and the wiring layer including the conductor 386 are described above, the semiconductor device of this embodiment is not limited to this structure. The number of wiring layers similar to the wiring layer including the conductor 356 may be three or less or five or more.

An insulator 210, an insulator 212, an insulator 214, and an insulator 216 are stacked in this order over the insulator 384. A material with a barrier property against oxygen or hydrogen is preferably used for any of the insulators 210, 212, 214, and 216.

For example, each of the insulator 210 and the insulator 214 is preferably formed using a film having a barrier property that prevents hydrogen or impurities from the substrate 311, a region where the transistor 300 is provided, or the like from diffusing to a region where the transistor 200 is provided. Therefore, each of the insulator 210 and the insulator 214 can be formed using a material similar to that for the insulator 324.

For the film having a barrier property against hydrogen, silicon nitride formed by a CVD method can be used, for example. The diffusion of hydrogen to a semiconductor element including an oxide semiconductor, such as the transistor 200, degrades the characteristics of the semiconductor element in some cases. Thus, a film that prevents hydrogen diffusion is preferably provided between the transistor 200 and the transistor 300. Specifically, the film that prevents hydrogen diffusion is a film from which a small amount of hydrogen is released.

For the film having a barrier property against hydrogen used for the insulator 210 and the insulator 214, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 200 in and after the manufacturing process of the transistor. In addition, release of oxygen from the oxide contained in the transistor 200 can be prevented. Therefore, aluminum oxide is suitably used for a protective film of the transistor 200.

The insulator 212 and the insulator 216 can be formed using a material similar to that for the insulator 320, for example. The use of a material with a relatively low dielectric constant for an interlayer film can reduce the parasitic capacitance between wirings. A silicon oxide film or a silicon oxynitride film can be used for the insulators 212 and 216, for example.

A conductor 218, a conductor included in the transistor 200 (a conductor 203), and the like are provided in the insulators 210, 212, 214, and 216. Note that the conductor 218 functions as a plug or a wiring that is connected to the capacitor 100 or the transistor 300. The conductor 218 can be formed using a material similar to that used for forming the conductor 328 and the conductor 330.

In particular, part of the conductor 218 that is in contact with the insulators 210 and 214 is preferably a conductor having a barrier property against oxygen, hydrogen, and water. With this structure, the transistor 300 and the transistor 200 can be separated by a layer having a barrier property against oxygen, hydrogen, and water. As a result, the diffusion of hydrogen from the transistor 300 to the transistor 200 can be prevented.

The transistor 200 is provided over the insulator 216.

As illustrated in FIGS. 13(A) and 13(B), the transistor 200 includes the conductor 203 disposed to be embedded in the insulator 214 and the insulator 216; an insulator 220 disposed over the insulator 216 and the conductor 203; an insulator 222 disposed over the insulator 220; an insulator 224 disposed over the insulator 222; an oxide 230a disposed over the insulator 224; an oxide 230b disposed over the oxide 230a; a conductor 242a and a conductor 242b disposed apart from each other over the oxide 230b; an insulator 280 which is disposed over the conductor 242a and the conductor 242b and in which an opening is formed between the conductor 242a and the conductor 242b; a conductor 260 disposed in the opening; an insulator 250 disposed between the conductor 260 and the oxide 230b, the conductor 242a, the conductor 242b, and the insulator 280; and an oxide 230c disposed between the insulator 250 and the oxide 230b, the conductor 242a, the conductor 242b, and the insulator 280. As illustrated in FIGS. 13(A) and 13(B), an insulator 244 is preferably disposed between the insulator 280 and the oxide 230a, the oxide 230b, the conductor 242a, and the conductor 242b. In addition, as illustrated in FIGS. 13(A) and 13(B), the conductor 260 preferably includes a conductor 260a provided inside the insulator 250 and a conductor 260b embedded inside the conductor 260a. Moreover, as illustrated in FIGS. 13(A) and 13(B), an insulator 274 is preferably disposed over the insulator 280, the conductor 260, and the insulator 250.

Hereinafter, the oxide 230a, the oxide 230b, and the oxide 230c are collectively referred to as an oxide 230 in some cases. The conductor 242a and the conductor 242b are collectively referred to as a conductor 242 in some cases.

The transistor 200 has a structure where the three oxides 230a, 230b, and 230c are stacked in the region where the channel is formed and its vicinity; however, the present invention is not limited to this structure. For example, the transistor may have a single-layer structure of the oxide 230b, a two-layer structure of the oxide 230b and the oxide 230a or 230c, or a stacked-layer structure of four or more layers. Although the conductor 260 has a two-layer structure in the transistor 200, the present invention is not limited to this structure. For example, the conductor 260 may have a single-layer structure or a stacked-layer structure of three or more layers. The transistor 200 illustrated in FIG. 12 and FIGS. 13(A) and 13(B) is just an example and is not limited to the structure shown therein; an appropriate transistor can be used in accordance with a circuit configuration or a driving method.

Here, the conductor 260 functions as a gate electrode of the transistor, and the conductor 242a and the conductor 242b function as a source electrode and a drain electrode. As described above, the conductor 260 is embedded in an opening of the insulator 280 and the region between the conductor 242a and the conductor 242b. The conductor 260, the conductor 242a, and the conductor 242b are formed in a self-aligned manner with respect to the position of the opening of the insulator 280. That is, in the transistor 200, the gate electrode can be positioned between the source electrode and the drain electrode in a self-aligned manner. Thus, the conductor 260 can be formed without an alignment margin, resulting in a reduction in the footprint of the transistor 200. Accordingly, miniaturization and high integration of the semiconductor device can be achieved.

Since the conductor 260 is formed in the region between the conductor 242a and the conductor 242b in a self-aligned manner, the conductor 260 has neither a region overlapping with the conductor 242a nor a region overlapping with the conductor 242b. Thus, parasitic capacitance formed between the conductor 260 and the conductors 242a and 242b can be reduced. As a result, the transistor 200 can have increased switching speed and excellent frequency characteristics.

The conductor 260 functions as a first gate (also referred to as top gate) electrode in some cases. The conductor 203 functions as a second gate (also referred to as bottom gate) electrode in some cases. In that case, the Vth of the transistor 200 can be controlled by changing a potential applied to the conductor 203 independently of a potential applied to the conductor 260. In particular, when a negative potential is applied to the conductor 203, the threshold voltage of the transistor 200 can be higher than 0 V, and the off-state current can be reduced. Thus, a drain current at the time when a potential applied to the conductor 260 is 0 V can be smaller in the case where a negative potential is applied to the conductor 203 than in the case where a negative potential is not applied to the conductor 203.

The conductor 203 is positioned to be overlapped by the oxide 230 and the conductor 260. Thus, when potentials are applied to the conductor 260 and the conductor 203, an electric field generated from the conductor 260 and an electric field generated from the conductor 203 spread, thereby surrounding the channel formation region in the oxide 230. In this specification and the like, a transistor structure in which the channel formation region is electrically surrounded by electric fields of the first gate electrode and the second gate electrode is referred to as surrounded channel (s-channel) structure.

The conductor 203 has a structure similar to that of the conductor 218; the conductor 203a is formed in contact with an inner wall of the opening in the insulators 214 and 216, and the conductor 203b is formed over and in contact with the conductor 203a.

The insulators 220, 222, 224, and 250 function as gate insulators.

Here, as the insulator 224 in contact with the oxide 230, an insulator containing more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced, leading to an improvement in reliability of the transistor 200.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

When the insulator 224 has an excess-oxygen region, the insulator 222 preferably has a function of inhibiting diffusion of oxygen (e.g., at least one of oxygen atoms and oxygen molecules). That is, it is preferred that oxygen be less likely to pass through the insulator 222.

The insulator 222 preferably has a function of inhibiting diffusion of oxygen or impurities, in which case diffusion of oxygen contained in the oxide 230 to the insulator 220 side is prevented. Furthermore, the conductor 203 can be prevented from reacting with oxygen in the insulator 224 or the oxide 230.

The insulator 222 preferably has a single-layer structure or a stacked-layer structure using an insulator containing a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as generation of leakage current may arise because of a thinner gate insulator. When a high-k material is used for an insulator functioning as the gate insulator, a gate potential at the time when the transistor operates can be reduced while the physical thickness of the gate insulator is maintained.

It is particularly preferable to use an insulator containing an oxide of one or both of aluminum and hafnium, which are insulating materials having a function of inhibiting diffusion of impurities, oxygen, and the like (i.e., insulating materials through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

It is preferable that the insulator 220 be thermally stable. For example, silicon oxide and silicon oxynitride are suitable because of their thermal stability. Furthermore, a combination of a high-k insulator and silicon oxide or nitrogen oxide silicon enables the insulators 220 and 226 to have a stacked-layer structure that is thermally stable and has a high dielectric constant.

Note that the insulators 220, 222, and 224 may each have a stacked-layer structure of two or more layers. In such cases, the stacked layers are not necessarily formed of the same material and may be formed of different materials.

In the transistor 200, a metal oxide functioning as an oxide semiconductor is preferably used as the oxide 230 including a channel formation region. For example, as the oxide 230, a metal oxide such as an In-M-Zn oxide (the element M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. Alternatively, an In—Ga oxide or an In—Zn oxide may be used as the oxide 230.

The metal oxide functioning as the channel formation region in the oxide 230 has a band gap of preferably 2 eV or higher, further preferably 2.5 eV or higher. The use of a metal oxide having a wide band gap can reduce the off-state current of the transistor.

By including the oxide 230*a* under the oxide 230*b*, the oxide 230 can prevent impurities from diffusing into the oxide 230*b* from the components formed below the oxide 230*a*. By including the oxide 230*c* over the oxide 230*b*, the oxide 230 can prevent impurities from diffusing into the oxide 230*b* from the components formed above the oxide 230*c*.

The oxide 230 preferably has a stacked-layer structure of oxides that differ in the atomic ratio of metal atoms. Specifically, the atomic ratio of the element M to the constituent elements in the metal oxide used as the oxide 230*a* is preferably greater than that in the metal oxide used as the oxide 230*b*. Moreover, the atomic ratio of the element M to In in the metal oxide used as the oxide 230*a* is preferably greater than that in the metal oxide used as the oxide 230*b*. Furthermore, the atomic ratio of In to the element M in the metal oxide used as the oxide 230*b* is preferably greater than that in the metal oxide used as the oxide 230*a*. The oxide 230*c* can be formed using a metal oxide that can be used as the oxide 230*a* or the oxide 230*b*.

The energy of the conduction band minimum of each of the oxides 230*a* and 230*c* is preferably higher than that of the oxide 230*b*. In other words, the electron affinity of each of the oxides 230*a* and 230*c* is preferably smaller than that of the oxide 230*b*.

Here, the energy level of the conduction band minimum is gradually varied at junction portions of the oxides 230*a*, 230*b*, and 230*c*. In other words, the energy level of the conduction band minimum at the junction portions of the oxides 230*a*, 230*b*, and 230*c* is continuously varied or continuously connected. To vary the energy level gradually, the density of defect states in a mixed layer formed at the interface between the oxides 230*a* and 230*b* and the interface between the oxides 230*b* and 230*c* is decreased.

Specifically, when the oxides 230*a* and 230*b* or the oxides 230*b* and 230*c* contain the same element (as a main component) in addition to oxygen, a mixed layer with a low density of defect states can be formed. For example, in the case where the oxide 230*b* is an In—Ga—Zn oxide, it is preferable to use an In—Ga—Zn oxide, a Ga—Zn oxide, gallium oxide, or the like as the oxides 230*a* and 230*c*.

At this time, the oxide 230*b* serves as a main carrier path. When the oxides 230*a* and 230*c* have the above structure, the density of defect states at the interface between the oxides 230*a* and 230*b* and the interface between the oxides 230*b* and 230*c* can be made low. Thus, the influence of interface scattering on carrier conduction is small, and the transistor 200 can have a high on-state current.

The conductors 242 (the conductors 242*a* and 242*b*) functioning as the source and drain electrodes are provided over the oxide 230*b*. For the conductors 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 13(A), regions 243 (a region 243*a* and a region 243*b*) are sometimes formed as low-resistance regions in the oxide 230 at and around the interface with the conductor 242. In this case, the region 243*a* functions as one of a source region and a drain region, and the region 243*b* functions as the other of the source region and the drain region. The channel formation region is formed in a region between the region 243*a* and the region 243*b*.

When the conductor 242 is provided in contact with the oxide 230, the oxygen concentration of the regions 243 sometimes decreases. In addition, a metal compound layer that contains the metal contained in the conductors 242 and the component of the oxide 230 is sometimes formed in the regions 243. In such cases, the carrier density of the regions 243 increase, and the regions 243 become low-resistance regions.

The insulator 244 is provided to cover the conductors 242 and inhibits oxidation of the conductors 242. Here, the insulator 244 may be provided to cover the side surface of the oxide 230 and to be in contact with the insulator 224.

A metal oxide containing one or more of hafnium, aluminum, gallium, yttrium, zirconium, tungsten, titanium, tantalum, nickel, germanium, magnesium, and the like can be used as the insulator 244.

It is particularly preferable to use an insulator containing an oxide of one or both of aluminum and hafnium, such as aluminum oxide, hafnium oxide, or an oxide containing aluminum and hafnium (hafnium aluminate) as the insulator 244. In particular, hafnium aluminate is preferable because it has higher heat resistance than a hafnium oxide film and thus is less likely to be crystallized by thermal budget in later steps. Note that the insulator 244 is not necessarily provided when the conductors 242 are oxidation-resistant or do not significantly lose the conductivity even after absorbing oxygen. Design is appropriately determined in consideration of required transistor characteristics.

The insulator 250 functions as a gate insulator. The insulator 250 is preferably disposed in contact with the inner side (the top surface and the side surface) of the oxide 230c. The insulator 250 is preferably formed using an insulator from which oxygen is released by heating. The insulator 250 is an oxide film in which the amount of released oxygen converted into oxygen molecules is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy analysis (TDS analysis), for example. Note that the film surface temperature in the TDS analysis is preferably higher than or equal to 100° C. and lower than or equal to 700° C.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When as the insulator 250, an insulator from which oxygen is released by heating is provided in contact with the top surface of the oxide 230c, oxygen can be effectively supplied from the insulator 250 to the channel formation region of the oxide 230b through the oxide 230c. Furthermore, as in the insulator 224, the concentration of impurities such as water or hydrogen in the insulator 250 is preferably lowered. The thickness of the insulator 250 is preferably greater than or equal to 1 nm and less than or equal to 20 nm.

In order to efficiently supply excess oxygen of the insulator 250 to the oxide 230, a metal oxide may be provided between the insulator 250 and the conductor 260. The metal oxide preferably prevents oxygen diffusion from the insulator 250 to the conductor 260. Providing the metal oxide that inhibits oxygen diffusion prevents diffusion of excess oxygen from the insulator 250 to the conductor 260. That is, a reduction in the amount of excess oxygen supplied to the oxide 230 can be inhibited. Moreover, oxidization of the conductor 260 due to excess oxygen can be suppressed. For the metal oxide, a material that can be used for the insulator 244 is used.

Although the conductor 260 serving as the first gate electrode has a two-layer structure in FIGS. 13(A) and 13(B), the conductor 260 may have a single-layer structure or a stacked-layer structure of three or more layers.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., N$_2$O, NO, and NO$_2$), and a copper atom. Alternatively, the conductor 260a is preferably formed using a conductive material having a function of inhibiting diffusion of oxygen (e.g., at least one of oxygen atoms, oxygen molecules, and the like). When the conductor 260a has a function of inhibiting diffusion of oxygen, it is possible to prevent a reduction in conductivity of the conductor 260b due to oxidation of the conductor 260b caused by oxygen in the insulator 250. As a conductive material having a function of inhibiting oxygen diffusion, tantalum, tantalum nitride, ruthenium, or ruthenium oxide is preferably used, for example.

The conductor 260b is preferably formed using a conductive material containing tungsten, copper, or aluminum as its main component. The conductor 260b also functions as a wiring and thus is preferably a conductor having high conductivity. For example, a conductive material containing tungsten, copper, or aluminum as its main component can be used. The conductor 260b may have a stacked-layer structure, for example, a stacked-layer structure of titanium or titanium nitride and any of the above conductive materials.

The insulator 280 is provided over the conductors 242 with the insulator 244 positioned therebetween. The insulator 280 preferably includes an excess-oxygen region. For example, the insulator 280 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 280 preferably includes an excess-oxygen region. When the insulator 280 from which oxygen is released by heating is provided in contact with the oxide 230c, oxygen in the insulator 280 can be efficiently supplied to a region 234 of the oxide 230 through the oxide 230c. The concentration of impurities such as water or hydrogen in the insulator 280 is preferably lowered.

The opening in the insulator 280 overlaps with the region between the conductor 242a and the conductor 242b. Accordingly, the conductor 260 is embedded in the opening of the insulator 280 and the region between the conductor 242a and the conductor 242b.

For miniaturization of the semiconductor device, the gate length needs to be short without reduction in conductivity of the conductor 260. When the conductor 260 is made thick to achieve this, the conductor 260 might have a shape with a high aspect ratio. Even when having a shape with a high aspect ratio, the conductor 260 can be formed without collapsing during the process because the conductor 260 is provided to be embedded in the opening of the insulator 280 in this embodiment.

The insulator 274 is preferably provided in contact with the top surface of the insulator 280, the top surface of the conductor 260, and the top surface of the insulator 250. When the insulator 274 is formed by a sputtering method, an excess-oxygen region can be provided in the insulators 250 and 280. Thus, oxygen can be supplied from the excess-oxygen regions to the oxide 230.

For example, a metal oxide containing one or more of hafnium, aluminum, gallium, yttrium, zirconium, tungsten, titanium, tantalum, nickel, germanium, magnesium, and the like can be used as the insulator 274.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 281 functioning as an interlayer film is preferably provided over the insulator 274. As in the insulator 224 or the like, the concentration of impurities such as water or hydrogen in the insulator 281 is preferably lowered.

A conductor 240a and a conductor 240b are provided in openings formed in the insulator 281, the insulator 274, the insulator 280, and the insulator 244. The conductor 240a and the conductor 240b are provided to face each other with the conductor 260 positioned therebetween. The conductors 240a and 240b have the same structure as that of a combination of a conductor 246 and a conductor 248 that will be described later.

An insulator 282 is provided over the insulator 281. A substance having a barrier property against oxygen and hydrogen is preferably used for the insulator 282. Thus, the insulator 282 can be formed using a material similar to that used for the insulator 214. For the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 200 in and after the manufacturing process of the transistor. In addition, release of oxygen from the oxide contained in the transistor 200 can be prevented. Therefore, aluminum oxide is suitably used for a protective film of the transistor 200.

An insulator 286 is provided over the insulator 282. The insulator 286 can be formed using a material similar to that used for the insulator 320. The use of a material with a relatively low dielectric constant for the interlayer film can reduce the parasitic capacitance between wirings. For example, a silicon oxide film or a silicon oxynitride film, can be used for the insulator 286.

The conductor 246, the conductor 248, and the like are embedded in the insulator 220, the insulator 222, the insulator 224, the insulator 244, the insulator 280, the insulator 274, the insulator 281, the insulator 282, and the insulator 286.

The conductors 246 and 248 function as plugs or wirings that are connected to the capacitor 100, the transistor 200, or the transistor 300. The conductors 246 and 248 can be formed using a material similar to those used for forming the conductors 328 and 330.

The capacitor 100 is provided above the transistor 200. The capacitor 100 includes a conductor 110, a conductor 120, and an insulator 130.

A conductor 112 may be provided over the conductors 246 and 248. The conductor 112 functions as a plug or a wiring that is connected to the transistor 200. The conductor 110 functions as an electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 12; however, one embodiment of the present invention is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 120 is provided so as to overlap with the conductor 110 with the insulator 130 positioned therebetween. The conductor 120 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, copper (Cu), aluminum (Al), or the like, which is a low-resistance metal material, can be used.

An insulator 150 is provided over the conductor 120 and the insulator 130. The insulator 150 can be formed using a material similar to that used for the insulator 320. The insulator 150 may function as a planarization film that covers roughness due to underlying layers.

With the use of this structure, a change in electrical characteristics can be prevented and reliability can be improved in a semiconductor device including a transistor including an oxide semiconductor.

<Structure Example of Transistor>

Although FIG. 12 and FIG. 13 illustrate a structure example in which the conductor 260 functioning as a gate is formed in the opening of the insulator 280, the structure of the OS transistor is not limited to this. For example, a structure in which the insulator is provided over the conductor can be used. A structure example of such a transistor is illustrated in FIG. 14 and FIG. 15.

Figure 14A:
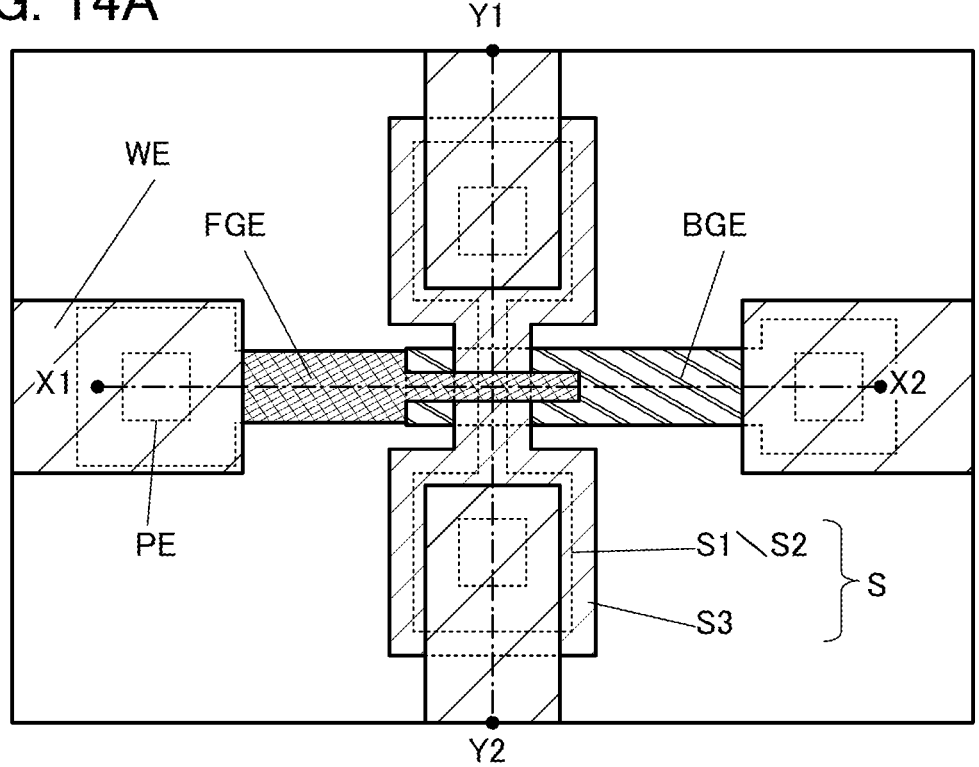
FIGS. 14A and 14B Diagrams illustrating a structure example of a transistor.
Figure 14B:
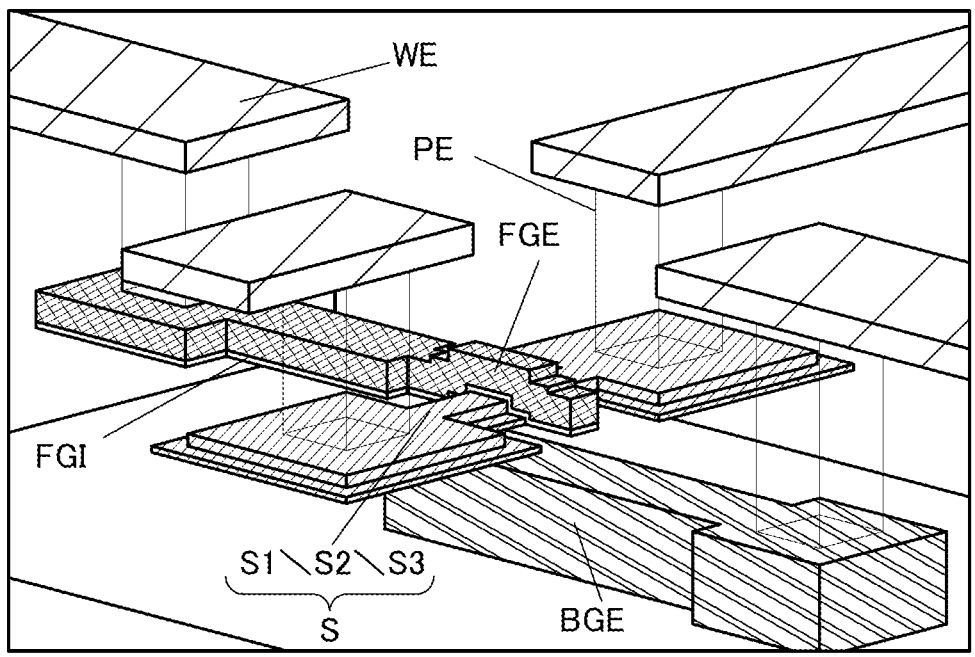
Figure 15A:
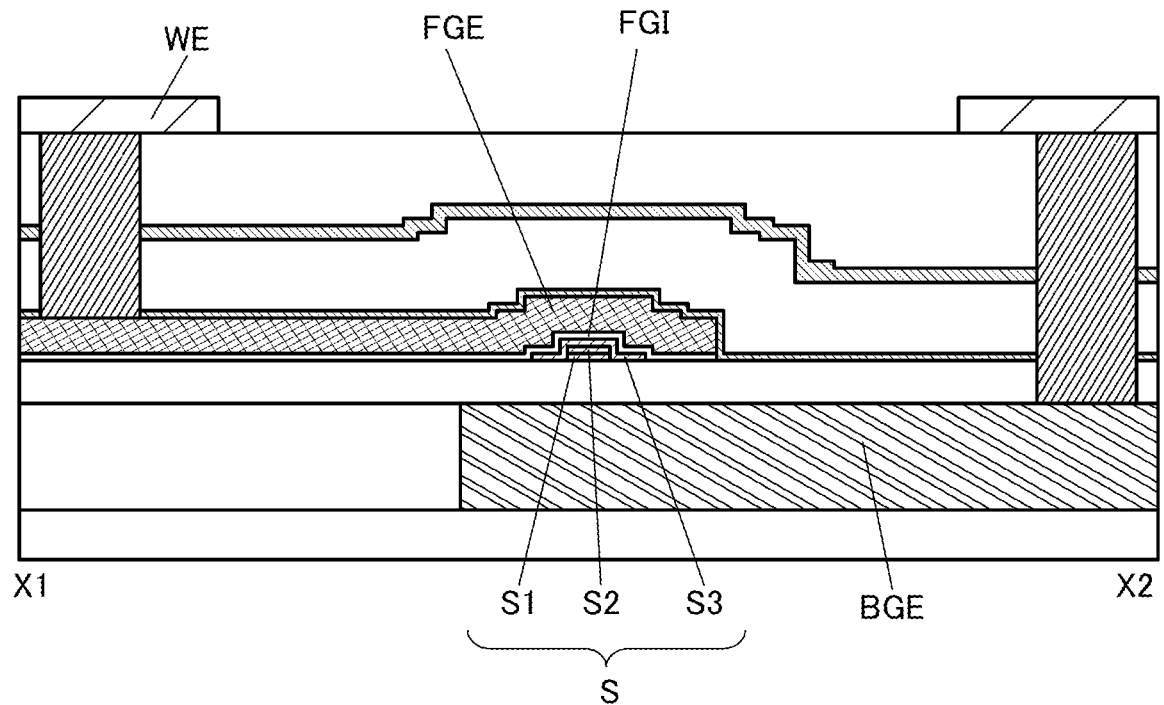
FIGS. 15A and 15B Diagrams illustrating a structure example of a transistor.
Figure 15B:
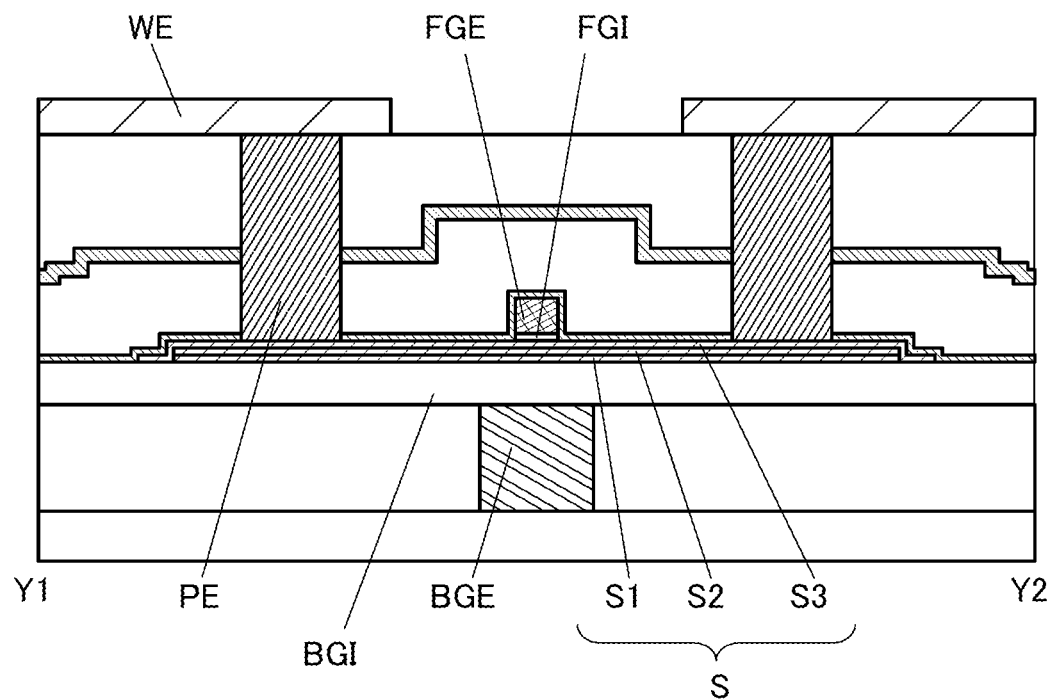

FIG. 14(A) is a top view of the transistor and FIG. 14(B) is a perspective view of the transistor. FIG. 15(A) is a cross-sectional view taken along X1-X2 in FIG. 14(A), and FIG. 15(B) is a cross-sectional view taken along Y1-Y2 in FIG. 14(A).

The transistor illustrated in FIG. 14 and FIG. 15 includes a conductor BGE having a function of a back gate, an insulator BGI having a function of a gate insulating film, an oxide semiconductor S, an insulator FGI having a function of a gate insulating film, a conductor FGE having a function of a front gate, and a conductor WE having a function of a wiring. A conductor PE has a function of a plug for connecting the conductor WE to the oxide semiconductor S, the conductor BGE, or the conductor FGE. Note that an example in which the oxide semiconductor S includes three layers of oxides S1, S2, and S3 is shown here.

Note that this embodiment can be combined with other embodiments in this specification as appropriate.

Embodiment 5

In this embodiment, the composition of a CAC (Cloud-Aligned Composite)-OS and a CAAC-OS (c-axis aligned crystal)-OS, which are metal oxides that can be used in the OS transistor described in the above embodiment, will be described. Note that in this specification and the like, CAC refers to an example of a function or a material composition and CAAC to be described later refers to an example of a crystal structure.

<Composition of Metal Oxide>

A CAC-OS or a CAC-metal oxide has a conducting function in a part of the material and has an insulating function in a part of the material, and has a function of a semiconductor as the whole material. Note that in the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC-metal oxide is formed of components having different bandgaps. For example, the CAC-OS or the CAC-metal oxide is formed of a component having a wide gap due to the insulating region and a component having a narrow gap due to the conductive region. When carriers flow in such a structure, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current drive capability in the on state of the transistor, that is, high on-state current and high field-effect mobility, can be obtained.

In other words, the CAC-OS or the CAC-metal oxide can also be called a matrix composite or a metal matrix composite.

<Structure of Metal Oxide>

An oxide semiconductor is classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the plurality of nanocrystals are connected.

The nanocrystal is basically a hexagon but is not always a regular hexagon and is a non-regular hexagon in some cases. Furthermore, a pentagonal lattice arrangement, a heptagonal lattice arrangement, and the like are included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of a lattice arrangement. This is probably because the CAAC-OS can tolerate distortion owing to a low density of oxygen atom arrangement in an a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. Furthermore, when indium of the In layer is replaced by the element M, the layer can also be referred to as an (In, M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

The nc-OS has a periodic atomic arrangement in a microscopic region (for example, a region with a size greater than or equal to 1 nm and less than or equal to 10 nm, in particular, a region with a size greater than or equal to 1 nm and less than or equal to 3 nm). In addition, no regularity of crystal orientation is observed between different nanocrystals in the nc-OS. Thus, the orientation is not observed in the whole film. Accordingly, in some cases, the nc-OS cannot be distinguished from an a-like OS or an amorphous oxide semiconductor depending on an analysis method.

The a-like OS is an oxide semiconductor that has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor has various structures with different properties. Two or more kinds among the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

Note that when the above oxide semiconductor is used for a transistor, a transistor with high field-effect mobility can be achieved. In addition, a transistor with high reliability can be achieved.

An oxide semiconductor with a low carrier density is preferably used for a transistor. In the case where the carrier density of an oxide semiconductor film is lowered, the impurity concentration in the oxide semiconductor film is lowered to lower the density of defect states. In this specification and the like, a state with a low impurity concentration and a low density of defect states is referred to as a highly purified intrinsic or substantially highly purified intrinsic state. For example, the carrier density of the oxide semiconductor is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$.

In addition, a highly purified intrinsic or substantially highly purified intrinsic oxide semiconductor film has a low density of defect states and accordingly has a low density of trap states in some cases.

Furthermore, charges trapped by the trap states in the oxide semiconductor take a long time to disappear and may behave like fixed charges. Thus, a transistor whose channel region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferred that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2 \times 10^{18}$ atoms/$cm^3$, preferably lower than or equal to $2 \times 10^{17}$ atoms/$cm^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferred to reduce the concentration of an alkali metal or an alkaline earth metal in the oxide semiconductor. Specifically, the concentration of an alkali metal or an alkaline earth metal in the oxide semiconductor obtained by SIMS is set lower than or equal to $1 \times 10^{18}$ atoms/$cm^3$, preferably lower than or equal to $2 \times 10^{16}$ atoms/$cm^3$.

Furthermore, when containing nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible; the nitrogen concentration in the oxide semiconductor obtained by SIMS is set, for example, lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, and still more preferably lower than or equal to $5 \times 10^{17}$ atoms/$cm^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1 \times 10^{20}$ atoms/$cm^3$, preferably lower than $1 \times 10^{19}$ atoms/$cm^3$, more preferably lower than $5 \times 10^{18}$ atoms/$cm^3$, and still more preferably lower than $1 \times 10^{18}$ atoms/$cm^3$.

When an oxide semiconductor with sufficiently reduced impurities is used for a channel region of a transistor, stable electrical characteristics can be given.

This embodiment can be combined with the description of the other embodiments as appropriate.

(Notes on the Description in this Specification and the Like)

The following are notes on the description of the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

<Notes on Ordinal Numbers>

Ordinal numbers such as "first," "second," and "third" in this specification and the like are used in order to avoid confusion among components. Thus, the ordinal numbers in this specification and the like do not limit the number of components and do not limit the order of components. In this specification and the like, for example, a "first" component in one embodiment can be referred to as a "second" component in other embodiments or claims. Furthermore, in this specification and the like, for example, a "first" component in one embodiment can be omitted in other embodiments or claims.

<Notes on Description for Drawings>

Embodiments are described with reference to drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted.

Moreover, in this specification and the like, terms for describing arrangement, such as "over" and "under," are used for convenience for describing the positional relation between components with reference to drawings. The positional relation between components is changed as appropriate in accordance with a direction in which the components are described. Thus, terms for describing arrangement are not limited to those described in this specification and the like and can be rephrased as appropriate according to circumstances. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A and does not exclude the case where another component is provided between the insulating layer A and the electrode B.

In drawings, the size, the layer thickness, or the region is shown arbitrarily for description convenience. Therefore, they are not limited to the scale. Note that the drawings are schematically shown for clarity, and embodiments of the present invention are not limited to shapes or values shown in the drawings. For example, variation in signal, voltage, or current due to noise or variation in signal, voltage, or current due to difference in timing can be included.

In drawings such as a perspective view, illustration of some components might be omitted for clarity of the drawings.

Moreover, the same components or components having similar functions, components formed using the same material, components formed at the same time, or the like in the drawings are denoted by the same reference numerals in some cases, and the repeated description thereof is omitted in some cases.

<Notes on Expressions that can be Rephrased>

In this specification and the like, expressions "one of a source and a drain" (or a first electrode or a first terminal) and "the other of the source and the drain" (or a second electrode or a second terminal) are used in the description of the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate according to circumstances. In this specification and the like, the two terminals other than the gate may be referred to as a first terminal and a second terminal or as a third terminal and a fourth terminal. Note that in this specification and the like, a channel formation region refers to a region where a channel is formed; this region is formed by application of a potential to the gate, so that current can flow between the source and the drain.

Furthermore, functions of a source and a drain might be switched when a transistor of opposite polarity is employed or a direction of current flow is changed in circuit operation, for example. Thus, the terms of source and drain can be used interchangeably in this specification and the like.

In addition, in this specification and the like, the term "electrode" or "wiring" does not functionally limit a component. For example, an "electrode" is used as part of a "wiring" in some cases, and vice versa. Furthermore, the term "electrode" or "wiring" can also mean the case where a plurality of "electrodes" or "wirings" are formed in an integrated manner.

In this specification and the like, voltage and potential can be replaced with each other as appropriate. Voltage refers to a potential difference from a reference potential, and when the reference potential is a ground potential, for example, voltage can be replaced with potential. The ground potential does not necessarily mean 0 V. Note that potentials are relative, and the potential supplied to a wiring or the like is changed depending on the reference potential, in some cases.

Note that in this specification and the like, the terms "film," "layer," and the like can be interchanged with each other depending on the case or according to circumstances. For example, the term "conductive layer" can be changed into the term "conductive film" in some cases. Moreover, the term "insulating film" can be changed into the term "insulating layer" in some cases. Alternatively, the term "film," "layer," or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

Note that in this specification and the like, the terms "wiring," "signal line," "power source line," and the like can be interchanged with each other depending on the case or according to circumstances. For example, the term "wiring" can be changed into the term "signal line" in some cases. Also, for example, the term "wiring" can be changed into the term "power source line" in some cases. Inversely, the term "signal line," "power source line," or the like can be changed into the term "wiring" in some cases. The term "power source line" or the like can be changed into the term "signal line" or the like in some cases. Inversely, the term "signal line" or the like can be changed into the term "power source line" or the like in some cases. The term "potential" that is applied to a wiring can be changed into the term "signal" or the like depending on the case or according to circumstances. Inversely, the term "signal" or the like can be changed into the term "potential" in some cases.

Notes on Definitions of Terms

Definitions of the terms mentioned in the above embodiments will be explained below.

<<Impurity in Semiconductor>>

An impurity in a semiconductor refers to, for example, an element other than the main components of a semiconductor layer. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, and nitrogen, for example. In the case of an oxide semiconductor, oxygen vacancies may be formed by entry of impurities such as hydrogen. Moreover, in the case where the semiconductor is silicon, examples of an impurity which changes characteristics of the semiconductor include oxygen, Group 1 elements except hydrogen, Group 2 elements, Group 13 elements, and Group 15 elements.

<<Switch>>

In this specification and the like, a switch is in a conduction state (on state) or in a non-conduction state (off state) to determine whether current flows or not. Alternatively, a switch has a function of selecting and changing a current path.

Examples of the switch that can be used are an electrical switch, a mechanical switch, and the like. That is, a switch can be any element capable of controlling current, and is not limited to a certain element.

Examples of the electrical switch are a transistor (for example, a bipolar transistor or a MOS transistor), a diode (for example, a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of the mechanical switch is a switch formed using a MEMS (micro electro mechanical system) technology, such as a digital micromirror device (DMD). Such a switch includes an electrode which can be moved mechanically, and operates by controlling conduction and non-conduction with movement of the electrode.

<<Connection>>

In this specification and the like, a description X and Y are connected includes the case where X and Y are electrically connected, the case where X and Y are functionally connected, and the case where X and Y are directly connected. Accordingly, without being limited to a predetermined connection relation, for example, a connection relation shown in drawings or text, a connection relation other than the connection relation shown in drawings or text is also included.

Note that X, Y, and the like used here each denote an object (for example, a device, an element, a circuit, a wiring, an electrode, a terminal, a conductive film, or a layer).

For example, in the case where X and Y are electrically connected, one or more elements that enable electrical connection between X and Y (for example, a switch, a transistor, a capacitor, an inductor, a resistor, a diode, a display element, a light-emitting element, or a load) can be connected between X and Y. Note that the switch has a function of being controlled to be turned on or off That is, the switch has a function of being in a conduction state (on state) or a non-conduction state (off state) to determine whether current flows or not.

For example, in the case where X and Y are functionally connected, one or more elements that enable functional connection between X and Y (for example, a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that, for example, even when another circuit is interposed between X and Y, X and Y are functionally connected if a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected."

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit configuration is defined by using an expression similar to these examples, a source (or a first terminal or the like) and a drain (or a second terminal or the like) of a transistor can be distinguished from each other to specify the technical scope. Note that these expressions are examples and expressions are not limited to these expressions. Here, each of X, Y, Z1, and Z2 denotes an object (for example, a device, an element, a circuit, a wiring, an electrode, a terminal, a conductive film, or a layer).

Note that even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes in its category such a case where one conductive film has functions of a plurality of components.

<<Parallel and Perpendicular>>

In this specification, "parallel" indicates a state where the angle formed between two straight lines is greater than or equal to −10° and less than or equal to 10°. Accordingly, the case where the angle is greater than or equal to −5° and less than or equal to 5° is also included. In addition, "substantially parallel" indicates a state where the angle formed between two straight lines is greater than or equal to −30° and less than or equal to 30°. In addition, "perpendicular" indicates a state where the angle formed between two straight lines is greater than or equal to 80° and less than or equal to 100°. Accordingly, the case where the angle is greater than or equal to 85° and less than or equal to 95° is also included. In addition, "substantially perpendicular" indicates a state where the angle formed between two straight lines is greater than or equal to 60° and less than or equal to 120°.

REFERENCE NUMERALS

MACF: arithmetic circuit, IS: current supply circuit, WDD: circuit, CLD: circuit, WLD: circuit, OFST: circuit, ACTV: activation function circuit, CS: bias circuit, SOC: current source circuit, SIC: current sink circuit, CUM: current mirror circuit, CUIN: internal circuit, AM[1]: memory cell, AM[2]: memory cell, AMref[1]: memory cell, AMref[2]: memory cell, WL[1]: wiring, WL[2]: wiring, CL[1]: wiring, CL[2]: wiring, WD: wiring, WDref: wiring, BL: wiring, BLref: wiring, VR0: wiring, ISL0: wiring, ISL1: wiring, ISL2: wiring, ISL3: wiring, ISL4: wiring, ISL5: wiring, OSM: wiring, OSP: wiring, VDDML: wiring, VSSML: wiring, VHL: wiring, BGL1: wiring, BGL2: wiring, IT: terminal, ITref: terminal, NP: terminal, NPref: terminal, NC: terminal, SW: analog switch, Tr11: transistor, Tr12: transistor, Tr31: transistor, Tr32: transistor, Tr40: transistor, Tr41: transistor, Tr42: transistor, Tr51: transistor, Tr52: transistor, Tr53: transistor, Tr61: transistor, Tr62: transistor, Tr63: transistor, CP: capacitor, C5: capacitor, C6: capacitor, WE: conductor, FGE: conductor, FGI: insulator, BGE: conductor, BGI: insulator, PE: conductor, S: oxide semiconductor, S1: oxide, S2: oxide, S3: oxide, 100: capacitor, 110: conductor, 112: conductor, 120: conductor, 130: insulator, 150: insulator, 200: transistor, 203: conductor, 203a: conductor, 203b: conductor, 210: insulator, 212: insulator, 214: insulator, 216: insulator, 218: conductor, 220: insulator, 222: insulator, 224: insulator, 230: oxide, 230a: oxide, 230b: oxide, 230c: oxide, 234: region, 240a: conductor, 240b: conductor, 242: conductor, 242a: conductor, 242b: conductor, 243: region, 243a: region, 243b: region, 244: insulator, 246: conductor, 248: conductor, 250: insulator, 260: conductor, 260a: conductor, 260b: conductor, 274: insulator, 280: insulator, 281: insulator, 282: insulator, 286: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: OSAI chip, 401: receiver, 403: digital-analog converter, 404: digital-analog converter, 405: MAC array, 406: MAC array, 407: gate driver, 408: digital-analog converter, 409: transmitter, 1001: wiring, 1002: wiring, 1003: wiring, 1004: wiring, 1005: wiring, 1006: wiring, 5100: server, 5200: portable game machine, 5201: housing, 5202: display portion, 5203: button, 5300: desktop information terminal, 5301: main body, 5302: display, 5303: keyboard, 5400: parallel computing machine, 5410: rack, 5420: calculator, 5421: PC card, 5422: board, 5423: connection terminal, 5424: connection terminal, 5425: connection terminal, 5426: chip, 5427: chip, 5428: connection terminal, 5430: motherboard, 5431: slot, 5432: connection terminal, 5433: connection terminal, 5500: information terminal, 5510: housing, 5511: display portion, 5600: TV, 5650: antenna, 5670: radio wave tower, 5675A: radio wave, 5675B: radio wave, 5680: broadcast station, 5700: automobile, 5800: electric refrigerator-freezer, 5801: housing, 5802: refrigerator door, 5803: freezer door, 6100: expansion device, 6101: housing, 6102: cap, 6103: USB connector, 6104: substrate, 6105: chip, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 6431: housing, 6432: display portion, 6433: palm print reading portion, 6434: wiring, 6435: hand, 7000: information terminal, 7010: housing, 7011: cover, 7012: monitor portion, 7013: keyboard, 7014: PC card, 7015: port.

The invention claimed is:

1. An electronic device comprising: a first circuit, a memory cell array, and a switch,
wherein the first circuit comprises a current mirror circuit, a second circuit, a first output terminal, and a second output terminal,
wherein the current mirror circuit comprises a third output terminal, a fourth output terminal, and a first transistor,
wherein the first output terminal and the third output terminal are electrically connected to the memory cell array,
wherein the second output terminal and the fourth output terminal are electrically connected to the memory cell array and a first terminal of the switch,
wherein the second circuit comprises a current source circuit, a current sink circuit, a second transistor, and a third transistor,
wherein a first terminal of the second transistor is electrically connected to a first terminal of the third transistor and the second output terminal,
wherein a second terminal of the second transistor is electrically connected to the current source circuit, and wherein a second terminal of the third transistor is electrically connected to the current sink circuit.

2. The electronic device according to claim 1, wherein the current mirror circuit comprises fourth to sixth transistors,
wherein each of the first transistor and the fourth to sixth transistors is a p-channel transistor,
wherein a first terminal of the fourth transistor is electrically connected to a second terminal of the first transistor and the third output terminal,
wherein a second terminal of the fourth transistor is electrically connected to a gate of the first transistor,
wherein a first terminal of the fifth transistor is electrically connected to the fourth output terminal, and
wherein a first terminal of the sixth transistor is electrically connected to the gate of the first transistor and a gate of the fifth transistor.

3. The electronic device according to claim 1, further comprising a third circuit,
wherein the third circuit comprises an input terminal and a fifth output terminal,
wherein the input terminal is electrically connected to a second terminal of the switch, and
wherein the third circuit samples an amount of change in current input to the input terminal, and outputs a potential corresponding to the amount of change to the fifth output terminal.

4. The electronic device according to claim 1,
wherein a first terminal of the first transistor is electrically connected to a wiring that supplies power supply voltage to the current mirror circuit, and
wherein the current mirror circuit is configured to output current corresponding to a potential of the third output terminal to the third output terminal and the fourth output terminal.

5. The electronic device according to claim 1, wherein the current source circuit comprises a seventh transistor, an eighth transistor, and a first capacitor,
wherein each of the second transistor and the seventh transistor is a p-channel transistor,
wherein the eighth transistor is an n-channel transistor,
wherein a first terminal of the seventh transistor is electrically connected to the second terminal of the second transistor and a first terminal of the eighth transistor,
wherein a gate of the seventh transistor is electrically connected to a second terminal of the eighth transistor and a first terminal of the first capacitor, and
wherein a second terminal of the seventh transistor is electrically connected to a second terminal of the first capacitor.

6. The electronic device according to claim 5, wherein the eighth transistor comprises a metal oxide in a channel formation region.

7. The electronic device according to claim 1, wherein the current sink circuit comprises a ninth transistor, a tenth transistor, and a second capacitor,
wherein the third transistor, the ninth transistor, and the tenth transistor are n-channel transistors,
wherein a first terminal of the ninth transistor is electrically connected to the second terminal of the third transistor and a first terminal of the tenth transistor,
wherein a gate of the ninth transistor is electrically connected to a second terminal of the tenth transistor and a first terminal of the second capacitor, and
wherein a second terminal of the ninth transistor is electrically connected to a second terminal of the second capacitor.

8. The electronic device according to claim 7, wherein at least one of the third transistor, the ninth transistor, and the tenth transistor comprises a metal oxide in a channel formation region.

9. The electronic device according to claim 1, wherein the memory cell array comprises a first memory cell and a second memory cell,
wherein each of the first memory cell and the second memory cell comprises an eleventh transistor, a twelfth transistor, and a third capacitor,
wherein in each of the first memory cell and the second memory cell, a first terminal of the eleventh transistor is electrically connected to a gate of the twelfth transistor and a first terminal of the third capacitor,
wherein a first terminal of the twelfth transistor in the first memory cell is electrically connected to the first output terminal, and
wherein a first terminal of the twelfth transistor in the second memory cell is electrically connected to the second output terminal and the first terminal of the switch.

10. The electronic device according to claim 9, wherein the eleventh transistor in each of the first memory cell and the second memory cell comprises a metal oxide in a channel formation region.

11. An electronic device comprising:
a first circuit, a memory cell array, and a switch,
wherein the first circuit comprises a current mirror circuit and a second circuit,
wherein the current mirror circuit is electrically connected to the memory cell array and the switch,
wherein the second circuit comprises a current source circuit, a current sink circuit, a second transistor, and a third transistor,
wherein a first terminal of the second transistor is electrically connected to a first terminal of the third transistor and the memory cell array and the switch,
wherein a second terminal of the second transistor is electrically connected to the current source circuit, and
wherein a second terminal of the third transistor is electrically connected to the current sink circuit.

12. The electronic device according to claim 11,
wherein the current mirror circuit comprises fourth to sixth transistors,
wherein a first terminal of the fourth transistor is electrically connected to the memory cell array,
wherein a first terminal of the sixth transistor is electrically connected to a gate of the fifth transistor.

13. The electronic device according to claim 11,
wherein the current source circuit comprises a seventh transistor, an eighth transistor, and a first capacitor,
wherein a first terminal of the seventh transistor is electrically connected to the second terminal of the second transistor and a first terminal of the eighth transistor,
wherein a gate of the seventh transistor is electrically connected to a second terminal of the eighth transistor and a first terminal of the first capacitor, and
wherein a second terminal of the seventh transistor is electrically connected to a second terminal of the first capacitor.

14. The electronic device according to claim 13,
wherein the eighth transistor comprises a metal oxide in a channel formation region.

15. The electronic device according to claim 11,
wherein the current sink circuit comprises a ninth transistor, a tenth transistor, and a second capacitor, wherein a first terminal of the ninth transistor is electrically connected to the second terminal of the third transistor and a first terminal of the tenth transistor, wherein a gate of the ninth transistor is electrically connected to a second terminal of the tenth transistor and a first terminal of the second capacitor, and wherein a second terminal of the ninth transistor is electrically connected to a second terminal of the second capacitor.

16. The electronic device according to claim 15, wherein at least one of the third transistor, the ninth transistor, and the tenth transistor comprises a metal oxide in a channel formation region.

* * * * *